US012272924B2

(12) United States Patent
Mateus et al.

(10) Patent No.: US 12,272,924 B2
(45) Date of Patent: *Apr. 8, 2025

(54) HCG TUNABLE VCSEL SYSTEM WITH ASIC FOR PROCESSING INFORMATION AND FIRMWARE

(71) Applicant: Bandwidth10, LTD., Berkeley, CA (US)

(72) Inventors: Carlos F. R. Mateus, Berkeley, CA (US); Christopher Chase, Berkeley, CA (US); Michael Huang, Berkeley, CA (US); Chuanshun Cao, Berkeley, CA (US); Dalila Ellafi, Berkeley, CA (US); Neelanjan Bandyopadhyay, Berkeley, CA (US); Carl V. Ford, Berkeley, CA (US); Kai Hui, Berkeley, CA (US); Philip Worland, Berkeley, CA (US)

(73) Assignee: Bandwidth10, LTD., Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/657,728

(22) Filed: May 7, 2024

(65) Prior Publication Data
US 2025/0023325 A1 Jan. 16, 2025

Related U.S. Application Data

(63) Continuation-in-part of application No. 18/536,323, filed on Dec. 12, 2023, now abandoned, and a
(Continued)

(51) Int. Cl.
H01S 5/026 (2006.01)
H01S 5/00 (2006.01)
(Continued)

(52) U.S. Cl.
CPC .......... H01S 5/0264 (2013.01); H01S 5/0064 (2013.01); H01S 5/02415 (2013.01);
(Continued)

(58) Field of Classification Search
CPC . H01S 5/18386; H01S 5/3416; H01S 5/18394
(Continued)

(56) References Cited

U.S. PATENT DOCUMENTS

2004/0179568 A1 9/2004 Amann et al.
2006/0140235 A1 6/2006 Kim
(Continued)

Primary Examiner — Tuan N Nguyen
(74) Attorney, Agent, or Firm — Paul Davis

(57) ABSTRACT

An (SOA) system includes a tunable VCSEL laser with one or more active regions having quantum wells and barriers. The one or more active regions are surrounded by one or more p-n junctions. The one or more active regions can include a selected shape structure, one or more tunnel junctions (TJ), one or more apertures provided with the selected shape structure, one or more buried tunnel junctions (BTJ) or oxide confine apertured, additional TJ's, planar structures and or additional BTJ's created during a regrowth process that is independent of a first growth process, the VCSEL having an HCG grading. At least one of an ASIC and driver controller coupled to the VCSEL laser, the ASIC monitoring an output of a light pulse over wavelength.

20 Claims, 32 Drawing Sheets

Related U.S. Application Data continuation-in-part of application No. 18/536,345, filed on Dec. 12, 2023, now abandoned, and a continuation-in-part of application No. 18/241,200, filed on Aug. 31, 2023, now abandoned, and a continuation-in-part of application No. 18/225,029, filed on Jul. 21, 2023, now abandoned, and a continuation-in-part of application No. 18/224,926, filed on Jul. 21, 2023, now abandoned, and a continuation-in-part of application No. 18/224,867, filed on Jul. 21, 2023, now abandoned, and a continuation-in-part of application No. 18/223,535, filed on Jul. 18, 2023, and a continuation-in-part of application No. 18/215,200, filed on Jun. 28, 2023, now abandoned, and a continuation-in-part of application No. 18/214,986, filed on Jun. 27, 2023, now abandoned, and a continuation-in-part of application No. 18/207,857, filed on Jun. 9, 2023, and a continuation-in-part of application No. 18/207,810, filed on Jun. 9, 2023, and a continuation-in-part of application No. 18/207,804, filed on Jun. 9, 2023, and a continuation-in-part of application No. 18/207,826, filed on Jun. 9, 2023, and a continuation-in-part of application No. 18/207,864, filed on Jun. 9, 2023, and a continuation-in-part of application No. 18/207,838, filed on Jun. 9, 2023, and a continuation-in-part of application No. 18/207,818, filed on Jun. 9, 2023, and a continuation-in-part of application No. 18/111,902, filed on Feb. 21, 2023, and a continuation-in-part of application No. 18/107,140, filed on Feb. 8, 2023.

(60) Provisional application No. 63/432,050, filed on Dec. 12, 2022.

(51) Int. Cl.
*H01S 5/024* (2006.01)
*H01S 5/183* (2006.01)
*H01S 5/30* (2006.01)
*H01S 5/50* (2006.01)

(52) U.S. Cl.
CPC ...... *H01S 5/18308* (2013.01); *H01S 5/18388* (2013.01); *H01S 5/18394* (2013.01); *H01S 5/3095* (2013.01); *H01S 5/50* (2013.01)

(58) Field of Classification Search
USPC .......................................................... 372/20
See application file for complete search history.

(56) References Cited

U.S. PATENT DOCUMENTS

| | | |
|---|---|---|
| 2006/0227835 A1 | 10/2006 | Ueki et al. |
| 2010/0128749 A1* | 5/2010 | Amann ............... H01S 5/18308 257/E21.085 |
| 2011/0280269 A1 | 11/2011 | Chang-Hasnain et al. |
| 2016/0270656 A1 | 9/2016 | Samec et al. |
| 2019/0387972 A1 | 12/2019 | Hu et al. |

* cited by examiner

12 - Bottom DBR mirror - n or p doping
14 - Active region (≅16 -QWs and barriers)
18 - p-n junction across active region 14
20 - Tunnel Junction 12 - Bottom DBR mirror - n or p doping
14 - Active region (≅16 -QWs and barriers)
18 - p-n junction across active region 14
22 - Spacing layers - p or n doping)

MANUFACTURING SEQUENCE

- Growth of bottom VCSEL - see below
- Next:
  . Timed etch of TJ, leaving some p++- target is 5-10nm
  . Regrowth of top VCSEL from etched seed layer ~40 nm thick TJ
AlGaInAs:C 12nm
AlInAs:C 34nm
Active Region Bottom DBR mirror
Inp seed Wafer

1st Growth

Mesa etch

HCG/MEMS Litho/Dry Etch

M1 cut

M2 - Open via access to bottom DBR contact

HCG TUNABLE VCSEL SYSTEM WITH ASIC FOR PROCESSING INFORMATION AND FIRMWARE

CROSS REFERENCE

This patent application claims priority from U.S. Provisional Application No. 63/432,050, title 'HCG TUNABLE VCSEL WITH INTEGRATED DETECTOR IN THE SACRIFICIAL LAYER', filed on Dec. 12, 2022; is a continuation in part of U.S. Non-Provisional patent application Ser. No. 18/107,140, title 'LIGHT EMITTING DEVICE WITH DETERMINABLE SHAPE OF OUTPUT BEAM', filed on Feb. 8, 2023; U.S. Non-Provisional patent application Ser. No. 18/111,902, title 'HCG TUNABLE VCSEL WITH ELECTRICAL AND OPTICAL CONFINEMENT VIA ETCHED POST', filed on Feb. 21, 2023; U.S. Non-Provisional patent application Ser. No. 18/207,804, title 'SYSTEMS FOR DETECTING GESTURES', filed on Jun. 9, 2023; U.S. Non-Provisional patent application Ser. No. 18/207,810, title 'SYSTEMS USING (3D) MAPS OF AT LEAST A PART OF A BODY OF A USER', filed on Jun. 9, 2023; U.S. Non-Provisional patent application Ser. No. 18/207,818, title 'SYSTEMS INCLUDING ONE OR MORE VCSELS, FOR RECEIVING A THREE DIMENSIONAL (3D) MAP OF AT LEAST A PART OF A BODY OF A USER', filed on Jun. 9, 2023; U.S. Non-Provisional patent application Ser. No. 18/207,826, title 'DIGITAL CAMERA WITH VCSELS", filed on Jun. 9, 2023; U.S. Non-Provisional patent application Ser. No. 18/207,864, title 'OPTOELECTRONIC DEVICE WITH VCSEL PROVIDING A GRID PATTERN", filed on Jun. 9, 2023; U.S. Non-Provisional patent application Ser. No. 18/207,838, title 'APPARATUS FOR FACIAL RECOGNITION", filed on Jun. 9, 2023; U.S. Non-Provisional patent application Ser. No. 18/207,857, title 'DEPTH MAPPING SENSING APPARATUS", filed on Jun. 9, 2023; U.S. Non-Provisional patent application Ser. No. 18/214,986, title 'HEALTH-MONITORING MEASUREMENT AND/OR MONITORING WITH A SMARTWATCH THAT INCLUDES ONE OR MORE VCSEL'S', filed on Jun. 27, 2023; U.S. Non-Provisional patent application Ser. No. 18/215,200, title 'VCSEL WITH TUNABLE GRATING', filed on Jun. 28, 2023; U.S. Non-Provisional patent application Ser. No. 18/223,535, title 'HEALTH-MONITORING DEVICE WIT VCSEL', filed on Jul. 18, 2023; U.S. Non-Provisional patent application Ser. No. 18/224,867, title 'HCG TUNABLE VCSEL WITH FULLY OXIDIZED BOTTOM DBR (GAAS BASED VCSEL)', filed on Jul. 21, 2023; U.S. Non-Provisional patent application Ser. No. 18/224,926, title 'HCG TUNABLE VCSEL WITH OPTICAL CONFINEMENT VIA STEP INDEX AND REGROWTH', filed on Jul. 21, 2023; U.S. Non-Provisional patent application Ser. No. 18/225,029, title 'TUNABLE VCSEL WITH ELECTRICAL AND OPTICAL CONFINEMENT IA ETCHED POST', filed on Jul. 21, 2023; U.S. Non-Provisional patent application Ser. No. 18/241,200, title 'FLIP CHIP TUNABLE VCSEL WITH HCG ON SI SUBMOUNT", filed on Aug. 31, 2023; U.S. Non-Provisional patent application Ser. No. 18/536,323, title 'VCSEL TRANSCEIVER MODULE', filed on Dec. 12, 2023; U.S. Non-Provisional patent application Ser. No. 18/536,345, title 'SEMICONDUCTOR OPTICAL AMPLIFIER WITH ASIC', filed on Dec. 12, 2023.

BACKGROUND

Field of the Invention

This invention relates to related to HCG tunable VCSEL's, and more particularly to tunable VCSEL's with at least one of an ASIC and driver controller coupled to the VCSEL laser, where the ASIC monitors an output of a light pulse over wavelength.

Description of the Related Art

Power monitoring of a VCSEL output is required for several applications. This is particularly true where power fluctuations mask the effect under observation or even causes saturation on detection.

One typical VCSEL power monitoring device uses complex optics and a beam splitter in the optical path for dropping a portion of power output.

In one method of monitoring the intensity of light generated by the VCSEL increases the complexity of the manufacturing process because additional epitaxial layers must be deposited to provide additional layers of a p-i-n photo diode. An additional etching process is required to delineate the photo diode. The etching process leaves the edges of the layers exposed to contamination which can compromise the reliability and accuracy of the arrangement.

Other methods used include, providing a Schottky structure formed as a photo detector on a top surface of the layer structure in which the VCSEL is formed. This arrangement also requires that additional layers be deposited on the layer structure of the VCSEL, albeit fewer than the number of additional layers required for the p-i-n photo diode.

In another method, a photo detector is delineated adjacent the VCSEL in the layer structure in which the VCSEL is formed. Light is transmitted laterally in the layer structure between the light-generating layer of the VCSEL and the photo detector. The magnitude of the current flowing through the photo detector in response to a reverse bias applied to the photo detector (as opposed to the forward bias to which the VCSEL is subject) represents the intensity of the light in the light generating layer of the VCSEL. This provides a structurally-simple way to monitor the intensity of the light in the light-generating layer of the VCSEL, but may not provide an acceptable intensity monitoring accuracy because the relationship between the intensity of the light in the light-generating layer and the intensity of the light beam actually emitted by the VCSEL is not well defined.

In one method of monitoring the intensity of light generated by the VCSEL MEMS actuated mirrors have been used. Electrostatic actuation is the most used, while several groups have also proposed piezoelectric and thermal actuation. For the electrostatic actuation, MEMS mirror and the rest of VCSEL structure have to be electrically isolated in order to build charge in between the structures and allow electrostatic attraction. Isolation layer is also known as sacrificial layer, as it is partially removed under MEMS to release the mirror structure and allow its movement. Usually, there is no sacrificial layer in the optical path and it is preserved only at the anchoring points. Thus, the effort has always been in the direction of making the sacrificial layer as resistive as possible, for full insulation. However, if the sacrificial layer material is correctly chosen to have its bandgap at the same wavelength of VCSEL operation and made slightly conductive (semi-insulating), then it is possible to consistently capture light scattered from the cavity and monitor power levels of VCSEL.

Optical coherence tomography (OCT) is a non-invasive imaging technique that provides detailed cross-sectional pictures of the retina, which is the light-sensitive tissue lining the back of the eye. OCT uses light waves to create these images, similar to how ultrasound works but with light instead of sound waves. It captures reflections from within the eye tissue, allowing it to generate precise cross-sectional views. In various embodiment, OCT: allows an ophthalmologist can visualize distinctive layers of the retina, these layers include the macula, which is crucial for central vision; by measuring the thickness of these layers, OCT aids in diagnosis and guides treatment. In various embodiments, OCT is used is a variety of applications, including but not limited to: glaucoma, monitoring changes in the optic nerve fibers caused by glaucoma; age-related macular degeneration (AMD), by assisting in assessing retinal health and detecting fluid or deformities; diabetic eye disease, evaluating the retina for signs of diabetic retinopathy, and the like.

During OCT, an ophthalmologist uses the beam from SOA to scan an area of a patient's eye. The OCT device then measures the light that the structures within the eye have reflected back. Thereafter, the OCT device uses these measurements to create images of a patient's retina that are cross-sectional and three-dimensional.

There is a need for VCSEL power monitoring that does not use output power. There is a further need for VCSEL power monitoring which uses only scattered light from inside an optical cavity. There is a further need for an improved OCT system.

SUMMARY

An object of the present invention is to provide a semiconductor optical amplifier (SOA) with at least one of an ASIC and driver controller coupled to a VCSEL laser.

Another object of the present invention is to provide an SOA with at least one of an ASIC and driver controller coupled to a VCSEL laser and monitors an output of a light pulse over wavelength.

A further object of the present invention is to provide an SOA with an ASIC and a a K-clock configured to correct a nonlinear sweep of a wavelength is corrected.

Yet another object of the present invention is to provide is to provide an SOA with an ASIC that shapes a wavelength to create a linear wavelength output.

These and other objects of the present invention are achieved in an (SOA) including a tunable VCSEL laser that produces with one or more active regions having quantum wells and barriers. The one or more active regions are surrounded by one or more p-n junctions. The one or more active regions can include a selected shape structure, and at least one of: one or more tunnel junctions (TJ). One or more apertures are provided with the selected shape structure. One or more buried tunnel junctions (BTJ) or oxide confine apertured, additional TJ's, planar structures and or additional BTJ's. The VCSEL has an HCG grading. At least one of an ASIC and driver controller is coupled to the VCSEL laser. The ASIC monitors an output of a light pulse over wavelength.

In another embodiment, a system for optical coherence tomography has a source of optical radiation including a tunable VCSEL laser with one or more active regions having quantum wells and barriers. The one or more active regions are surrounded by one or more p-n junctions. The one or more active regions can include a selected shape structure, and one or more tunnel junctions (TJ). One or more apertures are provided with the selected shape structure. One or more buried tunnel junctions (BTJ) or oxide confine apertured, additional TJ's, planar structures and or additional BTJ's. The VCSEL has an HCG grading. An interface medium is at a distal end of an optical fiber. A lens is in optical contact with the interface medium. The lens is configured to focus optical radiation through a side-opening window to a focal point in the target. Electronics are configured to receive the optical radiation reflected from the interface medium and a target. A processor generates an image of the target based upon the optical radiation received by the receiving electronics.

DETAILED DESCRIPTION

Figure 1A:
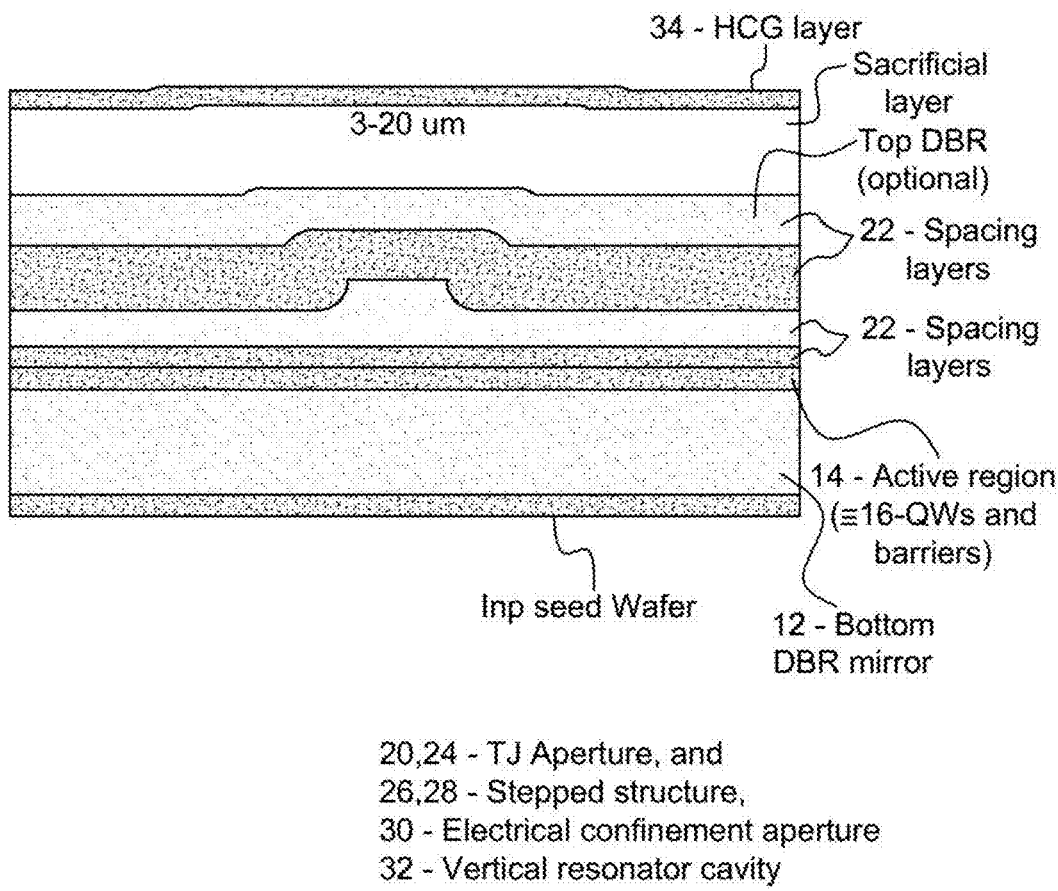
FIGS. 1A-1D illustrate embodiments of a light emitting device of the present invention.
Figure 1B:
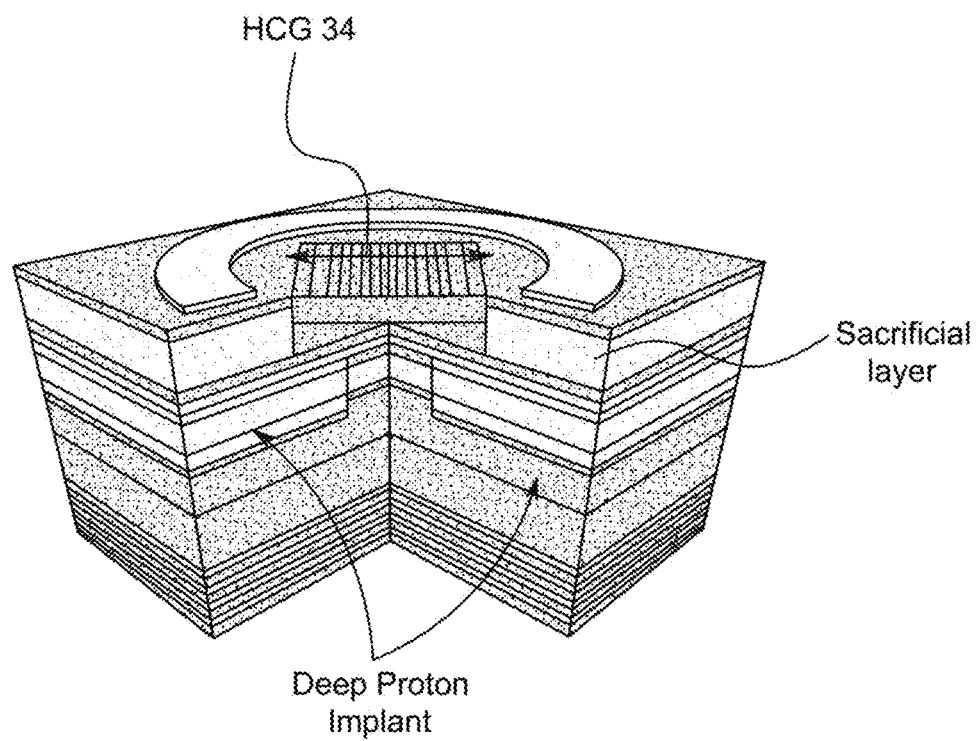
Figure 1C:
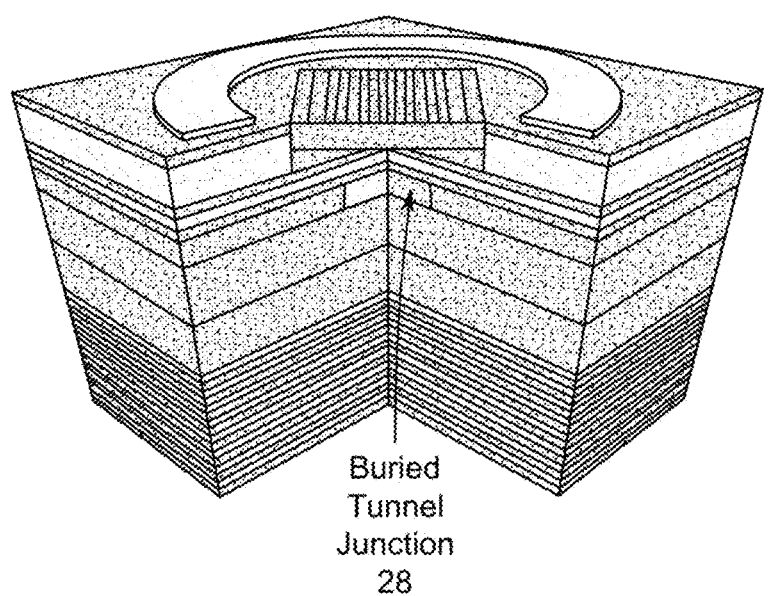

As used herein, the term engine refers to software, firmware, hardware, or other component that can be used to effectuate a purpose. The engine will typically include software instructions that are stored in non-volatile memory (also referred to as secondary memory) and a processor with instructions to execute the software. When the software instructions are executed, at least a subset of the software instructions can be loaded into memory (also referred to as primary memory) by a processor. The processor then executes the software instructions in memory. The processor may be a shared processor, a dedicated processor, or a combination of shared or dedicated processors. A typical program will include calls to hardware components (such as I/O devices), which typically requires the execution of drivers. The drivers may or may not be considered part of the engine, but the distinction is not critical.

As used herein, the term database is used broadly to include any known or convenient means for storing data, whether centralized or distributed, relational or otherwise.

As used herein a mobile device includes, but is not limited to, a cell phone, such as Apple's iPhone®, other portable electronic devices, such as Apple's iPod Touches®, Apple's iPads®, and mobile devices based on Google's Android® operating system, and any other portable electronic device that includes software, firmware, hardware, or a combination thereof that is capable of at least receiving a wireless signal, decoding if needed, and exchanging information with a server. Typical components of mobile device may include but are not limited to persistent memories like flash ROM, random access memory like SRAM, a camera, a battery, LCD driver, a display, a cellular antenna, a speaker, a BLUETOOTH® circuit, and WIFI circuitry, where the persistent memory may contain programs, applications, and/or an operating system for the mobile device. For purposes of this application, a mobile device is also defined to include a fob, and its equivalents.

As used herein, the term "computer" is a general-purpose device that can be programmed to carry out a finite set of arithmetic or logical operations. Since a sequence of operations can be readily changed, the communication device can solve more than one kind of problem. A communication device can include of at least one processing element, typically a central processing unit (CPU) and some form of memory. The processing element carries out arithmetic and logic operations, and a sequencing and control unit that can change the order of operations based on stored information. Peripheral devices allow information to be retrieved from an external source, and the result of operations saved and retrieved. Communication device also includes a graphic display medium.

As used herein, the term "internet" is a global system of interconnected computer networks that use the standard Network Systems protocol suite (TCP/IP) to serve billions of users worldwide. It is a network of networks that consists of millions of private, public, academic, business, and government networks, of local to global scope, that are linked by a broad array of electronic, wireless and optical networking technologies. The internet carries an extensive range of information resources and services, such as the inter-linked hypertext documents of the World Wide Web (WWW) and the infrastructure to support email. The communications infrastructure of the internet consists of its hardware components and a system of software layers that control various aspects of the architecture.

As used herein, the term "extranet" is a computer network that allows controlled access from the outside. An extranet can be an extension of an organization's intranet that is extended to users outside the organization in isolation from all other internet users. An extranet can be an intranet mapped onto the public internet or some other transmission system not accessible to the general public, but managed by more than one company's administrator(s). Examples of extranet-style networks include but are not limited to:

LANs or WANs belonging to multiple organizations and interconnected and accessed using remote dial-up LANs or WANs belonging to multiple organizations and interconnected and accessed using dedicated lines Virtual private network (VPN) that is comprised of LANs or WANs belonging to multiple organizations, and that extends usage to remote users using special "tunneling" software that creates a secure, usually encrypted network connection over public lines, sometimes vian ISP.

As used herein, the term "Intranet" is a network that is owned by a single organization that controls its security policies and network management. Examples of intranets include but are not limited to: s LAN, a Wide-area network (WAN) that is comprised of a LAN that extends usage to remote employees with dial-up access, a WAN that is comprised of interconnected LANs using dedicated communication lines, a Virtual private network (VPN) that is comprised of a LAN or WAN that extends usage to remote employees or networks using special "tunneling" software that creates a secure, usually encrypted connection over public lines, sometimes vian Internet Service Provider (ISP).

For purposes of the present invention, the Internet, extranets and intranets collectively are referred to as ("Network Systems").

As used herein "Cloud Application" refers to cloud application services or "software as a service" (SaaS) which deliver software over the Network Systems eliminating the need to install and run the application on a device.

As used herein "Cloud Platform" refers to a cloud platform services or "platform as a service" (PaaS) which deliver a computing platform and/or solution stack as a service, and facilitates the deployment of applications without the cost and complexity of obtaining and managing the underlying hardware and software layers.

As used herein "Cloud System" refers to cloud infrastructure services or "infrastructure as a service" (IAAS) which deliver computer infrastructure as a service with raw block storage and networking.

As used herein "Server" refers to server layers that consist of computer hardware and/or software products specifically designed for the delivery of cloud services.

As used herein, the term "user monitoring": (i) cardiac monitoring, which generally refers to continuous electrocardiogramith assessment of the user's condition relative to their cardiac rhythm. A small monitor worn by an ambulatory user for this purpose is known as a Holter Monitor. Cardiac monitoring can also involve cardiac output monitoring vian invasive Swan-Ganz catheter (ii) hemodynamic monitoring, which monitors the blood pressure and blood flow within the circulatory system. Blood pressure can be measured either invasively through an inserted blood pressure transducer assembly, or noninvasively with an inflatable blood pressure cuff. (iii) respiratory monitoring, such as: pulse oximetry which involves measurement of the saturated percentage of oxygen in the blood, referred to as SpO2, and measured by an infrared finger cuff, capnography, which involves CO2 measurements, referred to as EtCO2 or end-tidal carbon dioxide concentration. The respiratory rate monitored as such is called AWRR or airway respiratory rate). (iv) respiratory rate monitoring through a thoracic transducer belt, an ECG channel or via capnography, (v) Neurological monitoring, such as of intracranial pressure. Special user monitors can incorporate the monitoring of brain waves electroencephalography, gas anesthetic concentrations, bispectral index (BIS), and the like, (vi) blood glucose monitoring using glucose sensors. (vii) childbirth monitoring with sensors that monitor various aspects of childbirth. (viii) body temperature monitoring which in one embodiment is through an adhesive pad containing a thermoelectric transducer. (ix) stress monitoring that can utilize sensors to provide warnings when stress levels signs are rising before a human can notice it and provide alerts and suggestions. (x) epilepsy monitoring. (xi) toxicity monitoring, (xii) general lifestyle parameters, (xiii) sleep, including but not limited to: sleep patterns, type of sleep, sleep disorders, movement during sleep, waking up, falling asleep, problems with sleep, habits during, before and after sleep, time of sleep, length sleep in terms of the amount of time for each sleep, body activities during sleep, brain patterns during sleep and the like (xiv) body gesture, movement and motion (xv) body habits, (xvi) and the like.

Figure 1D:
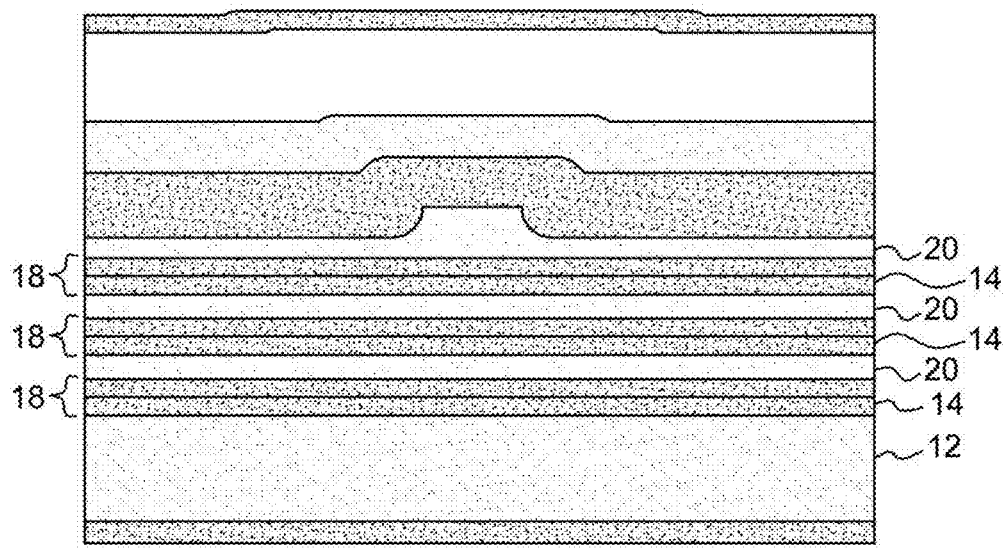

In one embodiment, illustrated in FIGS. 1A-1D, a light emitting device (VCSEL) 10 includes: a first mirror 12 ("DBR"), which can be a bottom mirror, and one or more active regions 14. First active region 14 is adjacent to the first mirror 12. The one or more active regions 14 are stacked in the light emitting device 10 to provide for a selected shape structure 26 (cavern) with an active region that includes a buried tunnel junction (BTJ) 28, another active region 14, another TJ 20 and so on. As illustrated in FIG. 1D VCSEL 10 monitoring pf VCSEL 10 is provided by sacrificial layer 25. The material in the sacrificial layer 25 is selected so that a bandgap is compatible to tuning spectra of HCG Tunable VCSEL 10. A physical cavity (cavern like) is created after a MEMS release. The cavity has walls distanced away from the optical beam. Walls are defined by the non-removed sacrificial layer. Dose doping in the sacrificial layer allows a very high resistance. This provides that electrostatic actuation of the MEMS mirror is possible, while still allowing very low current flow for optical detection.

The sacrificial layer 25 becomes an integrated detector for light scattered inside cavern 26. Laser light circulates inside the cavern 26 determined by mirrors: HCG on top and DBR on bottom. Some of it is scattered in the air/semiconductor interfaces and reach the sacrificial layer walls in the cavern. Data provided shows that this effect can be detected, controlled and used to infer laser output power. The integrated detector is what is left of the sacrificial layer after release; and detector interface are the walls inside the cavern.

Figure 2:
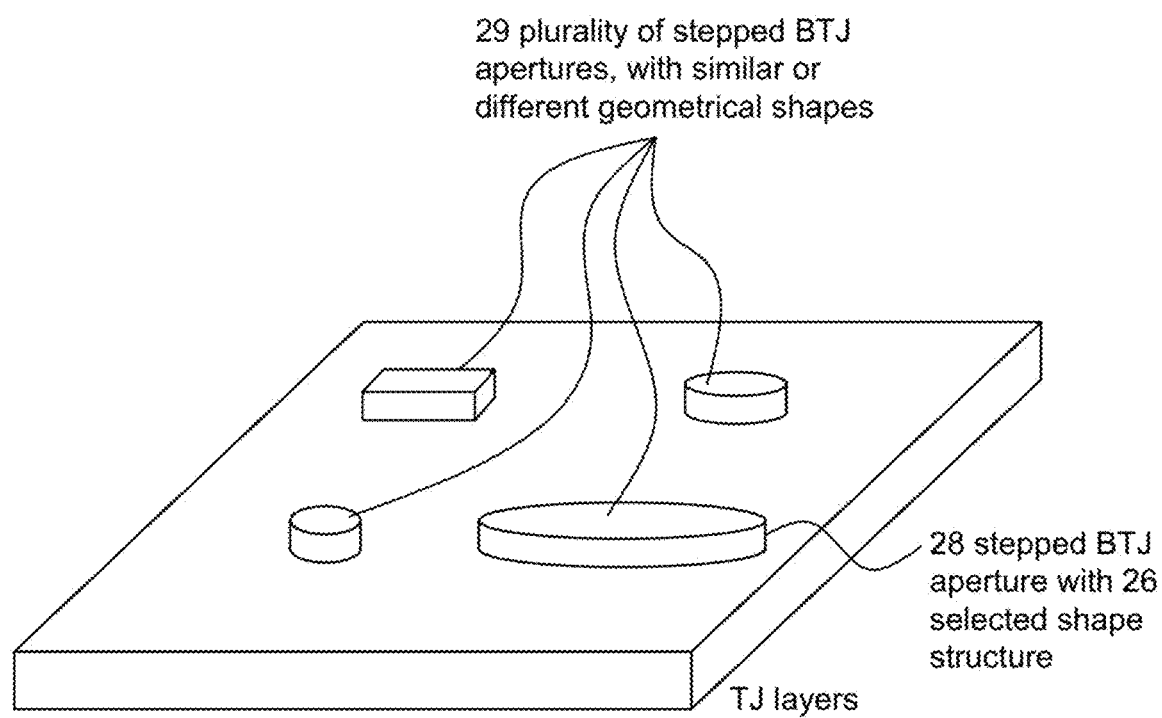
FIG. 2 illustrates an embodiment with several stepped BTJ apertures with different geometric shapes.
Figure 3:
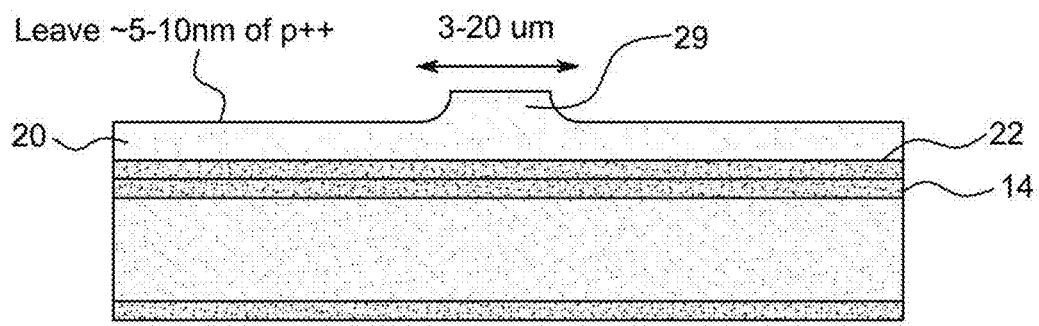
FIG. 3 illustrates a shaped structure, which can be a plateau, of the present invention.

As illustrated in FIG. 2 there can be a repetition of active regions 14 and TJ's 20, providing a plurality of successive active regions 14 with TJ's 20, as illustrated in FIG. 2. Each active region 14 includes quantum wells and barriers 16 surrounded by one or more p-n junctions 18, see FIG. 3. As previously recited, one or more TJ's 20 are provided. Each of an aperture 24 is provided with a selected shaped structure 26, illustrated in FIG. 4. As non-limiting examples, the selected shape structure 26 can be open or closed, geometric or non-geometric shape, and the like. The shape of the selected shape structure 26 is based on a desired optical transmission function for a desired application, as shown in FIG. 4.

Figure 4:
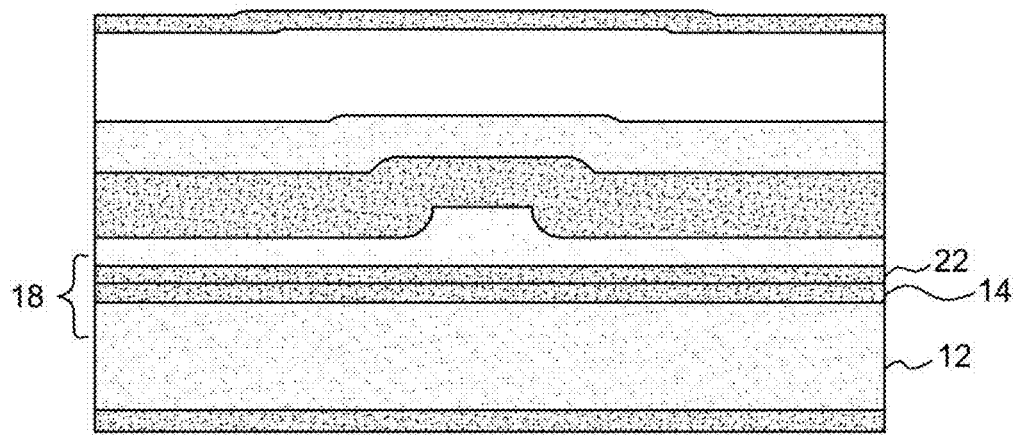
FIG. 4 illustrates one embodiment of a P-N junction.

In one embodiment, the selected shape structure 26 is a stepped structure, see FIG. 4. The degree of the stepping can be at a variety of different angles, as determined by the etching process. The selected shape structure 26 can be substantially any geometry, including but not limited to a four corned star, circular, square and the like. As a non-limiting example, the selected shape structure 26 can be created using an inverse design. The selected shape structure 26 is selected in order to create an optimal desired far field pattern depending on the desired application. As a non-limiting example, the selected shape structure 26 is formed by etching.

In one embodiment, a first growth is used to create the bottom mirror 12, TJs 20, active regions 14, and the like. In one embodiment, a selected geometric configuration buried tunnel junction 28 is created during a regrowth process. The light emitting device 10 is created by the first growth, followed by a second or regrowth of the first growth. The first growth creates a planar structure. Additional BTJ's 28 are created from second, third and the like regrowth's. The creation of multiple BTJ's is formed during multiple regrowth processes. All of these regrowth's are independent of the first growth process.

An area 30 is defined by the one or more BTJ's 28, additional TJ's 20, planar structures and/or addition BTJ's 28. A vertical resonator cavity 32 is defined by a second mirror over the electrical confinement aperture 30, see FIG. 6. A high contract grading (HCG) 34 operates as a second mirror positioned at the top of the vertical resonator cavity 32.

Figure 5:
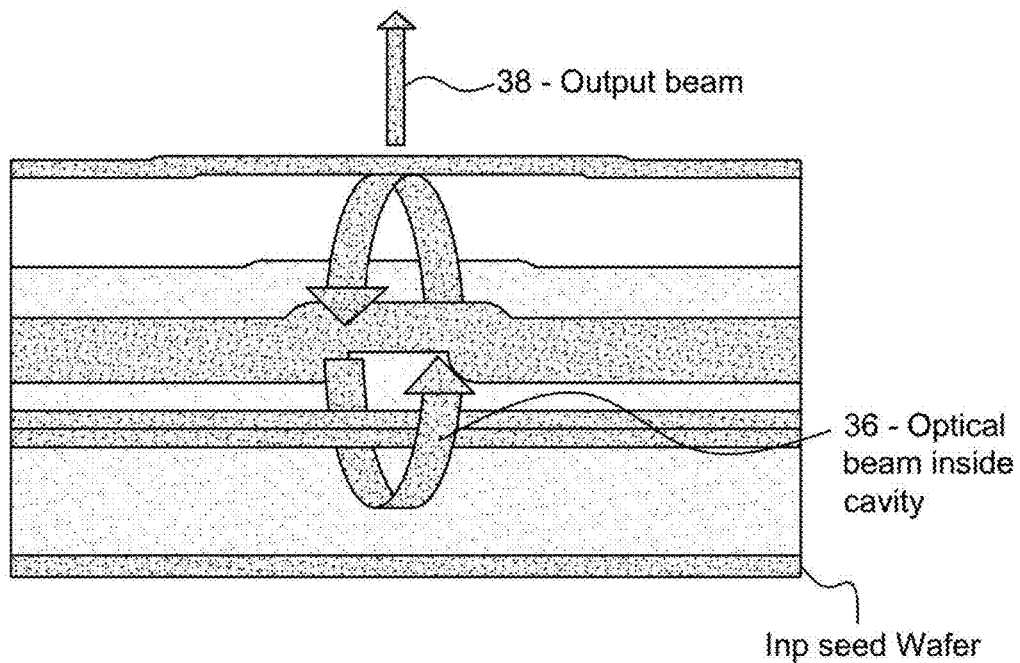
FIG. 5 illustrates an embodiment of FIG. 1A with an output beam and an optical beam inside of a cavity.
Figure 6:
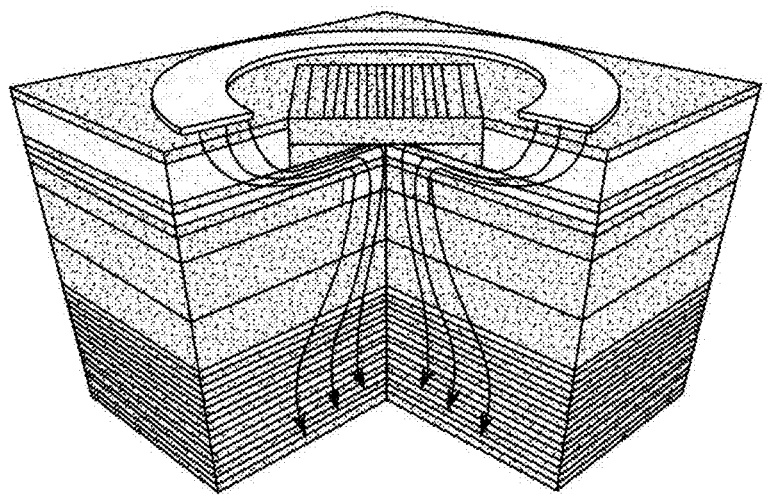
FIG. 6 illustrates one embodiment of electrical current confinement through a BTJ aperture, where electrical current flow from a top to a bottom contact.
Figure 7:
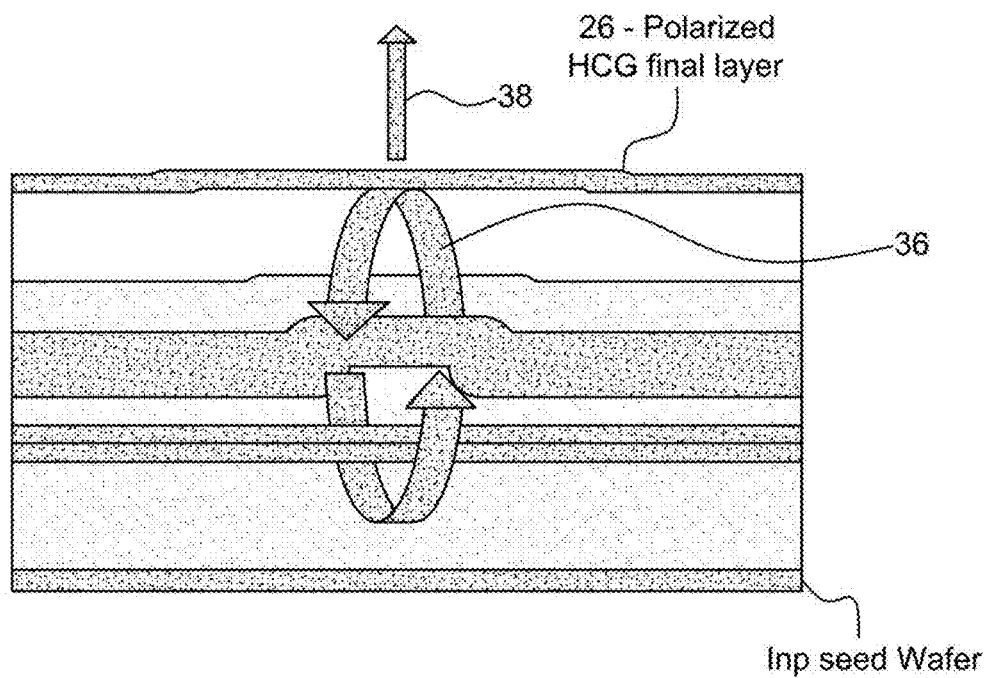
FIG. 7 is similar to FIG. 3, but with a planarized HCG final layer.
Figure 8:
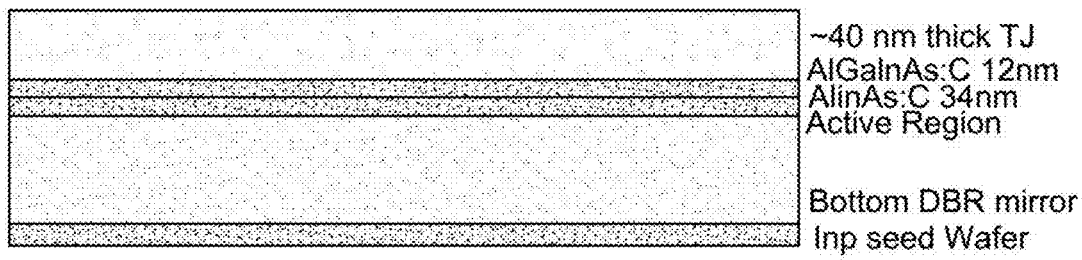
FIG. 8 illustrates one embodiment of a manufacturing sequence with a growth of a bottom, a timed etch of the TJ, leaving some p++, and a regrowth on top of a VCSEL from an etched seed layer.
Figure 9:
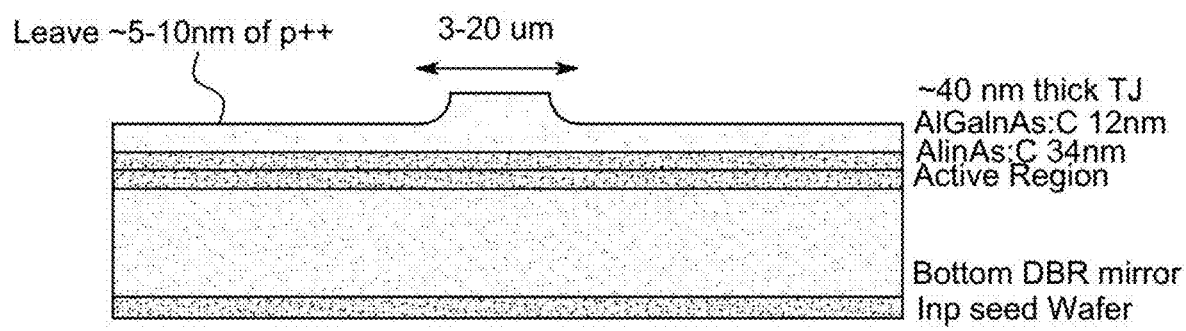
FIG. 9 illustrates one embodiment of a manufacturing sequence with a timed slow etch.
Figure 10:
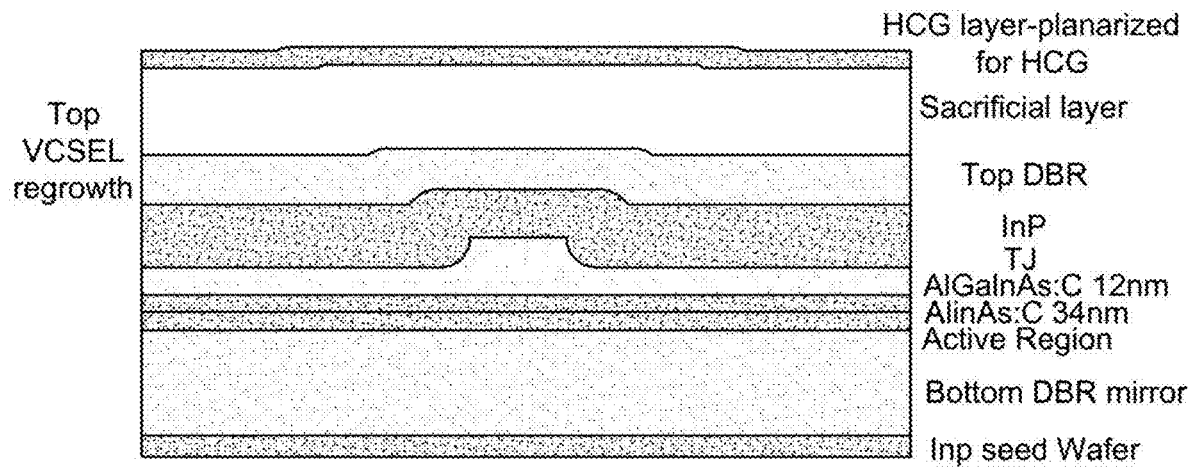
FIG. 10 illustrates one embodiment of a manufacturing sequence with a regrowth of n-InP with grading, and a regrowth of a top DBR, sacrificial layer and HCG layer.

In one embodiment, the HCG 34 conformally covers the selected shape structure 26 layered on the selected shape structure 26. The HCG 34 remains anchored by a variety of different methods including not limited to: a membrane, or membrane structure, by beams after partial removal of sacrificial layer in order to move with respect to the optical resonator and modify a cavity length and consequent wavelength emitted by light emitting structure, and the like. A shape of the output beam 38, as in FIGS. 5 and 6, is determined by a geometric shape of the one or more BTJ apertures 29, and the apertures for additional TJ's 20, planar structures and/or additional BTJ's 28. and a transmission function of the HCG 34. HCG 34 is designed according to a desired optical transmission function for a desired application.

As a non-limiting example, the HCG 34 operates as a second mirror positioned over the vertical resonator cavity 32. In one embodiment, a shape of the output beam of light emitting device 10 is determined by a geometric shape of the one or more BTJ apertures 29, and apertures for additional TJ's 20, planar structures and/or additional BTJ's 28.

As a non-limiting example, the far field transmission range is application dependent. As a non-limiting example, the output beam can be a plurality of different geometries including but not limited to circular, elliptical and the like.

The selected shape structure can be created by a variety of ways. As non-limiting examples, the selected shape structure can be created can be made with a grid, a circular array of dots, a screen, hole and screens, and the like.

In one embodiment, the light emitting device 10 is a VCSEL (hereafter referred to as ("VCSEL 10").

Relative to efficiency, the VCSEL 10 can be designed to maximize the light output relative to the desired application. Additionally, the number of BTJ's 28 created can be in response to the application.

In one embodiment, a shape of the output beam 38 is configured from a design of the electrical confinement aperture 30. As a non-limiting example, a geometry of the electrical confinement aperture 30 is slightly asymmetric to provide that the beam 36 inside the VCSEL 10 provides a Gaussian beam shape as the output beam 38 from the HCG 34.

In one embodiment, a coupling loss of the output beam 38 to a fiber or wavelength is reduced when VCSEL output beam 38 is designed to match the fiber modes. As a non-limiting example, the HCG 34 controls one or more of: an output beam 38 polarization, optical beam 3 shape and a single longitudinal wavelength. As a non-limiting example, the HCG 34 is further released from selected shape structure 26 by selective etch of spacing layers 22. In one embodiment, p-doping is on a top of the active region 14 leading to n-doping to a bottom of active region 14.

In one embodiment, at least a portion of the spacing layers 22 above the one or more BTJ apertures 29, the apertures for additional TJ's 20, planar structures and/or addition BTJ's 28, have thicknesses defined as multiples of quarter-wavelength of target lasing wavelength, in one embodiment, spacing layers and the top DBR 42 can have different thickness. As a non-limiting example, the top DBR 42 has a smaller number of layers than the bottom DBR.

Spacing layers 22 can also be used for electrical current spreading, thermal dissipation, or minimizing optical absorption, for example, but not limited to those ends.

In one embodiment, a top DBR 42 is not included in VCSEL 10. The sacrificial layer 44 of semiconductor material is removed via etching at specific locations in order to release the top DBR 42 mirror tuning structure. In one embodiment, the etching of the sacrificial layer 44 uses a wet or dry etch process. The sacrificial layer 44 can remain when the top mirror (DBR) 42 is not moveable as a non-tunable design and has a low index of refraction compared to a material of the top DBR 42. Successive steps are used in the growth of the VCSEL 10 and can also provide lateral optical confinement due to a graded lens effect. An epitaxial growth and a regrowth of the VCSEL 10 is achieved.

In one embodiment, HCG 34 is formed of a semiconductor epitaxial layer. HCG 34 is layered on a selected shape structure 26, that can be less than 100 nm. In one embodiment, VCSEL 10 produces a stable linearly polarized output defined by HCG 34. In one embodiment of the present invention, VCSEL 10 is created by a process of two independent epitaxial growths. In one embodiment, first and second epitaxial growth structures are characterized, and formed by epitaxial growth.

As a non-limiting example, the first epitaxial growth structure is on a seed substrate 46 of III-V semiconductor material and includes: the bottom mirror Distributed Bragg Reflector (DBR) 26 on a top surface of the seed substrate 46 is defined by alternate layers of high and low index of refraction. Active region, generally denoted as 24, is adjacent to first mirror 12, consisting of quantum wells and barriers 16. A plurality of layers 22 can be optional. The final layer, and the at least one TJ 20, are etched laterally to define an etched electrical confinement aperture 30 through which an electrical current flow. The HCG 34 and spacing layers 22 are formed over in a stepped format (selected shape structure 26). The etched electrical confinement aperture 30 being the one or more BTJs 28 that is a selected shape structure 26, as a result of further regrowth.

As a non-limiting example, the one or more BTJS 28 provide for VCSEL 10 current confinement in a VCSEL 10, and can be implemented for any VCSEL 10 in the SWIR band, from 650 to 1800 nm. More particularly, this can for InP based VCSELs 10 (above 1300 nm).

In one embodiment, for current confinement, the VCSEL 10 of the present invention uses the one or more BTJ's 28, additional TJ's 20, planar structures and/or addition BTJ's 2, instead of ion implant or oxide aperture.

As a non-limiting example, the VCSEL 10 with the one or more BTJ's 28, a BTJ 28 and can provide better current blocking outside of electrical confinement aperture 30 than ion implanted apertures and also provide good reliability.

In one embodiment, of the first epitaxial growth structure, the top surface of the seed substrate 46 is defined by alternate layers of high and low index of refraction.

In one embodiment, of the first epitaxial growth structure, the active region 14 is a source of light from an electrooptic effect due to a recombination of holes and electron. As a non-limiting example, the active region 14 is undoped and surrounded by one or more p-n junctions in order to promote recombination of electrons-holes.

In one embodiment, of the first epitaxial growth structure, at least a portion of the plurality of spacing layers 22 have a varied thicknesses depending on an optical design. In one embodiment, at least a portion of the plurality of spacing layers 22 are adjacent to the active region 14 or to additional spacing layers 22.

In one embodiment of the first epitaxial growth structure, the TJ 20 is a highly doped p++ layer directly on the top of a highly doped n++ layer.

In one embodiment of the first epitaxial growth structure, final layer is made of a same material of the seed substrate 46.

In one embodiment of the first epitaxial growth structure, the final layer is not included, depending on the optical design.

The TJ 20 layer is etched laterally and defines the selected shape structure 26, that is chosen based on the application. This becomes the one or more BTJs 28, a BTJ 28 additional TJ's 20, planar structures and/or addition BTJ's 28.

In one embodiment, a second epitaxial growth structure starts on a top of the first epitaxial growth structure after TJ 20 lateral etch. In one embodiment, the second epitaxial growth structure is a regrowth on top of the first stepped epitaxial growth structure, creating the one or more BTJs 28 from the one or more TJs 20, This becomes the one or more BTJs 28, additional TJ's 20, planar structures and/or addition BTJ's 28.

In one embodiment, the second epitaxial growth structure includes: spacing layers 22; an optional top DBR 42 mirror; a sacrificial layer; a top layer, which supports the top mirror (DBR) 42 manufacturing; and extra layers for supporting metal contacts.

In one embodiment, the p-doping is on a top of the active region 14 leading to n-doping to the bottom of the active region 14. In one embodiment, this is reversed and the n-doping is on the top of the active region 14, the p-doping is on the bottom.

In one embodiment of the second epitaxial growth structure, the second epitaxial growth structure starts on a top of the previously processed semiconductor stack.

In one embodiment of the second epitaxial growth structure, the second epitaxial growth structure includes spacing layers 22. As a non-limiting example, these spacing layers 22 have a varied thickness depending on the optical design.

In one embodiment of the second epitaxial growth structure, the spacing layers 22 are above the etched TJ 20 aperture. In one embodiment, the etch of the TJ 20 can be etching into the layers below the TJ 20. The TJ 20 and the layers below it can be fully etched, partially etched and the like. As a non-limiting example, the profile of the etch can be based of the selected application, and sidewalls can be created with sidewall angles of 20 to 90 degrees. the sidewalls of the etch can be created based on etching recipe, RF power, the type of chemicals used, crystal dependence, as well the desired end application. In one embodiment of the second epitaxial growth structure, they are added to complete a multiple of quarter-wavelength of a target lasing wavelength. In one embodiment, they have different thickness. In one embodiment, the spacing layers 22 are also used for electrical current spreading, thermal dissipation, or minimizing an optical absorption, and the like.

In one embodiment of the second epitaxial growth structure, the second epitaxial growth structure has a possible top DBR 42 mirror on top of a seed substrate 46, defined by alternating layers of high and low index of refraction of semiconductor. This top DBR 42 is not mandatory and, as a non-limiting example, has a much smaller number of layers when compared to bottom DBR 26, if it is included in the stack, and optimized based on the application, as well as two beam parameters. In one embodiment, the two beam parameters are reflectivity and the wavelength bandwidth of the mirror.

In one embodiment of the second epitaxial growth structure, the second epitaxial growth structure can be application specific, and include specific spacing sacrificial layer of semiconductor material under top mirror (DBR) 42. This can be removed via etching at specific locations in order to release the tuning structure. In various embodiments, the etching of the sacrificial layer can be achieved with a wet or dry etch process. In one embodiment, this layer can alternatively remain in the structure if the top mirror (DBR) 42 is not supposed to move (non-tunable design) and has a low index of refraction compared to the top mirror (DBR) 42 material. In one embodiment, the index of refraction is application and can be as large as possible.

In one embodiment of the second epitaxial growth structure, the top mirror (DBR) 42 layer is processed during a post regrowth using an etching process and becomes a periodic structure designed to resonate and work as a mirror at specific wavelengths.

In one embodiment, the periodic structure is a high contrast metastructure (HCM) or high contrast grading HCG 34, known as subwavelength grading, or a photonic crystal structure. In one embodiment, the mirror effect requires a lower or a same index of refraction around the periodic structure, which can be air, if released, or other semiconductor or dielectric material, if not released. When it is a tunable structure, the periodic structure is actuated in order to change the optical length of optical cavity vian external input that causes movement of the periodic structure. In one embodiment, an external input is based on thermal, electrostatic or piezoelectric excitation. In one embodiment of the tunable design, tunability can also be achieved by heating the VCSEL 10 or changing its driving current.

In one embodiment of the second epitaxial growth structure, the second epitaxial growth structure extra layers are provided that are designed for supporting metal contacts.

In various embodiment, VCSEL 10 is at least one of: an air-cavity-dominant (ACD) or a semiconductor-cavity-dominant (SCD) design. In one embodiment, the regrowth process is configured to be nearly conformal and increase the lateral dimension of initial BTJ step as defined by the electrical confinement aperture 30 during deposition of epitaxial layers in the second epitaxial regrowth, in one embodiment, the regrowth process decreases a height of this step as more and more layers are added. In one embodiment, at the end, the periodic structure for the first mirror 12 is defined on a selected shape structure 26, which, however, does not have to be necessarily a plane.

As non-limiting examples, the successive steps can provide for lateral optical confinement due to a graded lens effect and improve overall efficiency of VCSEL 10.

In one embodiment, the epitaxial growth and regrowth of the VCSEL 10 can be achieved by conventional III-V epitaxy, such as molecular beam epitaxy (MBE) or metalloorganic chemical vapor deposition (MOCVD) or other techniques including but not limited to LPE, SPE and the like. While MBE can provide better control of each atomic layer, MOCVD can provide a better step coverage.

The HCG 34 can provide strong polarization control since the grading, HCG 34, acts as a polarizer, i.e., only stable linear polarization is transmitted through the grading, HCG 34, In one embodiment, the non-planar structure is formed due to the regrowth process which is started on selected shape structure 26 with TJ 20 delimited by a top of a selected geometric structure, including but not limited to a mesa.

In one embodiment, the one or more BTJ apertures 29 that are created during one or more regrowth. After regrowth, etched TJ 29 becomes BTJ 20, a buried TJ.

In one embodiment, the HCG 34 is configured to reflect a first portion of light 36 back into the vertical resonator cavity 32. A second portion of light 38 is transmitted as an output beam from the light emitting structure 10. As a non-limiting example, every time the first portion of light 36 is reflected into the vertical resonator cavity 32, portions of light, constituting the second portion of light 38, come out of the light emitting structure 10. As a non-limiting example, the first portion of light 36 bounces around the vertical resonator cavity 36, with a portion coming out as the second portion of light 38.

As a non-limiting example, after sufficient thick regrowth, selected shape structure 26 can become planar, a plane plateau, and the like. It can easier to control processing of the periodic structure. In one embodiment, HCG 34 can be manufactured on a curved of stepwise layer, as far as continuous. In one embodiment, a final dimension of the plane plateau is originated from the epitaxial growth on top of electrical confinement aperture 30 and depends on a thickness of intermediary layers and growth conditions. As a non-limiting example, this thickness can be in the range of 10 μm to 20 μm for a starting electrical confinement aperture 30 with a 3-μm diameter.

In one embodiment, VCSEL 10 is integrated in line detector behind it for FMCW applications, where the reflected light reflects into the VCSEL, causing optical feedback. The detector behind the VCSEL detects power oscillations due to the feedback and the signal can be used to reconstruct the 3D environment.

In one embodiment, a photodetector is at a side of an air gap in s tuning cavity as a detector. As a non-limiting example, the semiconductor, to the side of the air gap in the tunable structure, act as the photodetector and collect scattered light from the HCG and VCSEL body interface due to non-idealities. This offers some advantage to the application in 1) because the photodetector is outside of the cavity and does not contribute any additional feedback, simplifying the signal processing.

In one embodiment, a sensing apparatus includes a VCSEL 10 including one or more active regions 14. Each active region 14 has quantum wells and barriers 16. Active regions 14 are surrounded by one or more p-n junctions, the one or more active regions including a selected shape structure each with a tunnel junction (TJ). One or more apertures are provided with the selected shape structure. One or more buried tunnel junctions (BTJ) 28 or oxide confine aperture, additional TJ's 20, planar structures and/or additional BTJ's 28 are created during a regrowth process that is independent of a first growth process. An output of VCSEL 19 is determined in response to an application of the light emitting device. In one embodiment, bottom DBR 12 can include an HCG and dielectric coating with one or more layers of the dielectric coating.

In one embodiment, the dielectric coating is a stack of high/low index layers. As non-limiting examples, the dielectric coating can be a stack of 5-10, 6-10, 7-10, 10 high/low index pairs of dielectric. The dielectric provides a wider tuning range. This provides a broad wavelength mirror. In one embodiment, the top DBR mirror 42 is s a moveable mirror.

With tunable, a specific wavelength is targeted and VCSEL 10 remains at that wavelength. Changing cavity 32 size allows VCSEL 10 to move, and physically change the cavity 32 size for each application. In one embodiment, wavelength locking control is provided. This requires an external reference including but not limited to a chip that taps the light. This is then coupled to a reference system. The reference system and the chip are external to the VCSEL In one embodiment, atomic plots are used for the reference system.

As non-limiting examples, ranges of output power can be: one additional active region (or junction) can add ~1× power, and the laser could become 2× more powerful. However, as it also adds extra heat coming from additional optical power inside cavity, efficiency goes down. Thus, by adding more junctions we can have more power but to the price that the laser cannot work continuously anymore. Typical multi-junction VCSELs work on pulsed mode and it is very hard to predict range of output power. As a rule of thumb, we can say that 2 junctions will have 2× more power on pulsed operation, 3 junctions 3×. As one increases the number of junctions, pulses have to become faster and intervals longer.

In one embodiment, the output power is from 1 milliwatt to 5 milliwatts per aperture. In one embodiment, multi-junction devices have output powers of 10-20 milliwatts, 12-17 milliwatts, and 15 milliwatts. In one embodiment, the oxide confinement defines aperture 24 for electrical current confinement.

As a non-limiting example, a number of quantum wells can be the same in all junctions, but not necessarily. Individual quantum well design can also be slightly different in order to broaden spectral material gain and increase tuning range.

In one embodiment, a regular VCSEL apparatus 10 includes current injection via the one or more BTJs 28, TJ's 20, planar structures and/or additional BTJ's without ion implantation.

As a non-limiting example, VCSEL apparatus 10 includes one or more BTJ's 28 and is tunable. In one embodiment, formation of the one or more BTJ's 28 TJ's 20, planar structures and/or additional BTJ's, requires an etch of a TJ aperture and regrowth of a top semiconductor epitaxial structure. As a non-limiting example, the process results on a non-flat surface, not suitable for an HCG 34. Moreover, uneven surface and regrowth process causes additional strain which also prevents MEMS manufacturing. In one embodiment, this requires relaxation of epitaxial growth through careful design of regrowth and MEMS actuation on the non-planar surface.

In one embodiment, VCSEL 10 formation includes the steps of:

(i) growing a semiconductor active cavity material consisting of a multi-quantum well layer stack sandwiched between bottom and top spacer regions, the top spacer region terminating with a p-layer and a p++/n++ tunnel junction grown on top of the p-layer, each of the p++- and p-layer presenting a p-type layer;

(ii) etching the active cavity material formed in step (i) to form a top of a selected geometric structure such as a mesa, including at least the upper n++ layer of the tunnel junction emerging from the underlying p-type layer, thereby creating a structured surface of the active cavity material formed by the upper surface of the upper surface of the p-type layer outside a top of a selected structure such as a mesa;

(iii) applying a wafer fusion between the structured surface of the active cavity material and a substantially planar surface of a n-type semiconductor layer of a first distributed Bragg reflector (DBR) stack, thereby causing deformation of the fused surface around a top of a selected structure such as a mesa, and defining an electrical confinement aperture 30 for electrical current flow therethrough, the electrical confinement aperture 30 including a top of a selected structure such as a mesa, surrounded by an air gap between the deformed fused surfaces and defining an active region 14 of the device;

(iv) forming a second DBR stack on the surface of the active cavity material opposite to the structured surface;

(v) forming ohmic contacts on the VCSEL device structure to enable the electrical current flow through the electrical confinement aperture 30 to the active region 14.

In one embodiment, VCSEL apparatus 10 is made with the following processes: epitaxial growth of VCSEL up to tunnel junction (TJ) layer 20; development of TJ etches; identify etchants compatible to the TJ design 20; and development of regrowth process.

Surface compatibility to regrowth—not all surfaces or all materials are suitable for seeding the regrowth process—there is a trade off in between the best design for the TJ 20 and a design good enough which is suitable for regrowth.

Regrowth has to be carried long enough in order to planarize the surface where HCG 34 is manufactured on one or more of: VCSEL regular processing; growth of bottom VCSEL and then: etch of TJ 20, leaving some p++-target is 5-10 nm and regrowth of top VCSEL from etched seed layer.

Then there is: a regrowth of n-InP with grading; a regrowth of top DBR 42 (if included in design), sacrificial layer and HCG 34; followed by standard VCSEL manufacturing.

Figure 11A:
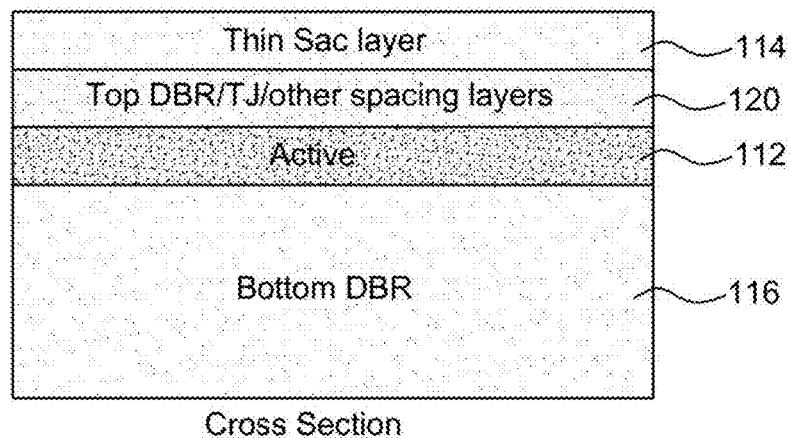
FIGS. 11A and 11B illustrate a first regrowth including a bottom DBR, active layer (region), top DBR and other spacing layers.
Figure 11B:
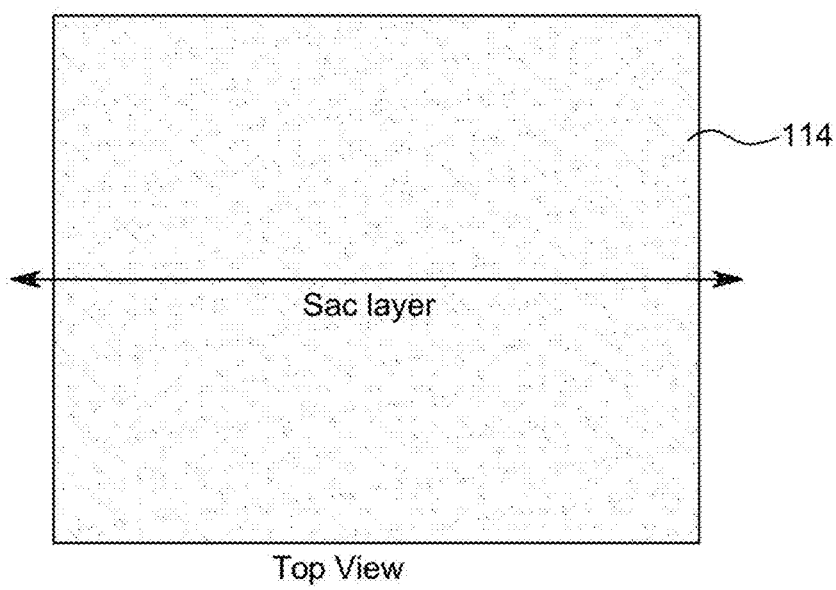
Figure 12A:
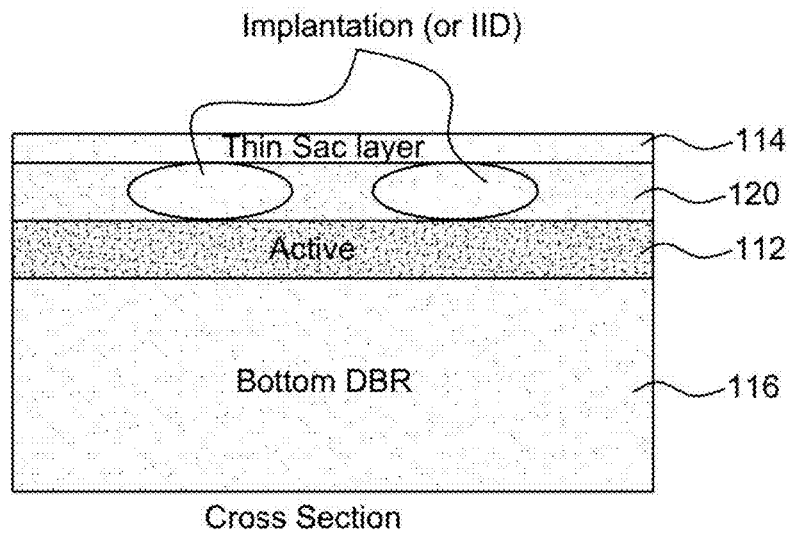
FIGS. 12A and 12B illustrates one embodiment of implantation.
Figure 12B:
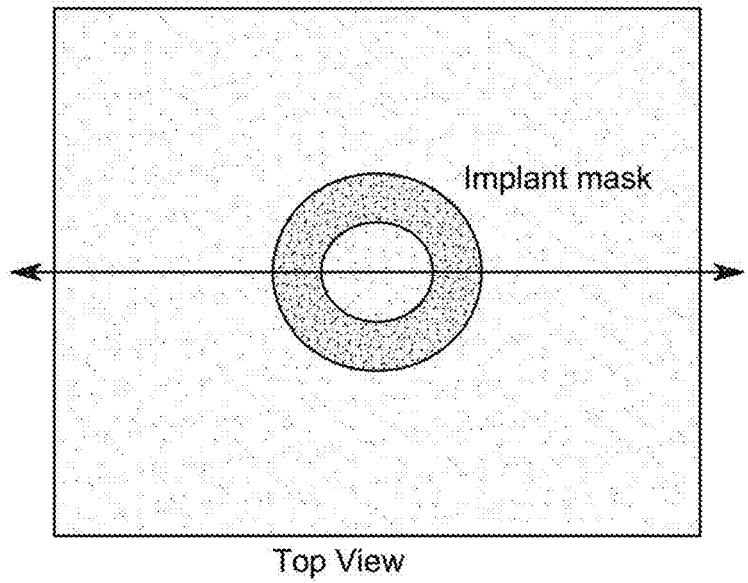

In one embodiment a regular VCSEL 10 epitaxial structure includes an etched post between an active region 112 and a sacrificial layer 114. FIGS. 11A and 11B illustrate a first regrowth including a bottom DBR 116, active layer (region) 112, top DBR 118/other spacing layers 120. The sacrificial layer 114 has a thickness now greater than 100 nm. The optical confinement is defined by the etched post 110 which acts as a waveguide. FIGS. 12A and 12B illustrates one embodiment of implantation.

In one embodiment, an etched post 110 and regrowth provide lateral current and optical confinement, small volume and increased efficiency for more demanding applications, such as very high-speed modulation and coherent communication. The increased efficiency is achieved because the optical wave and the lateral currents overlap.

Instead of etching the post 110 for confinement in the optical path via mesa etch and regrowth, the optical path is preserved and modify its boundaries for optical confinement. The existence of the sacrificial layer 114 in the present invention favors this new approach as the final interface of regrown material in the optical path is etched away. This preserves optical quality. As a non-limiting example, the manufacturing requires integration and compatibility of several different processes, not required for the conventional semiconductor as-grown DBR.

Regrowth of the sacrificial layer 114 around a small mesa 122 step brings much smaller complication when compared to previous approaches of buried heterostructures with steep walls more than 2× taller (3-4 μm) than mesa 122 (0.8 μm). In one embodiment, a full VCSEL is grown up to a thin SAC layer (100 nm of A10.22Ga0.25In0.53As with 100 nm InP cap). As illustrated in FIGS. 12A and 12B implantation is then proceeded for current confinement under the metal contact pads. In illustrates the etched post 110.

Figure 13A:
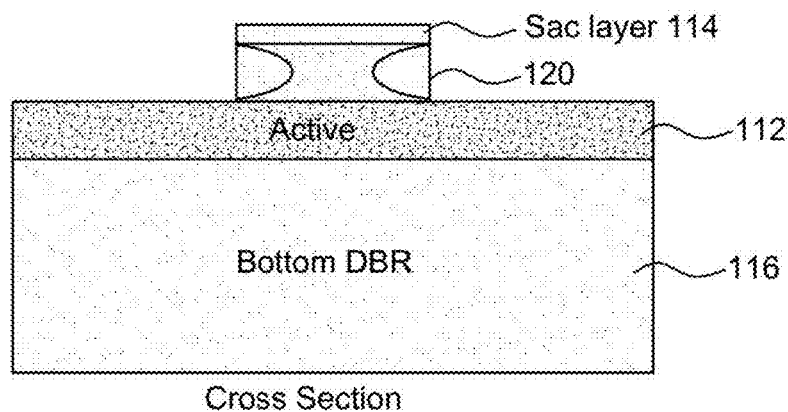
FIGS. 13A and 13B illustrate cross sections and top views of a mesa etch of the present invention.
Figure 13B:
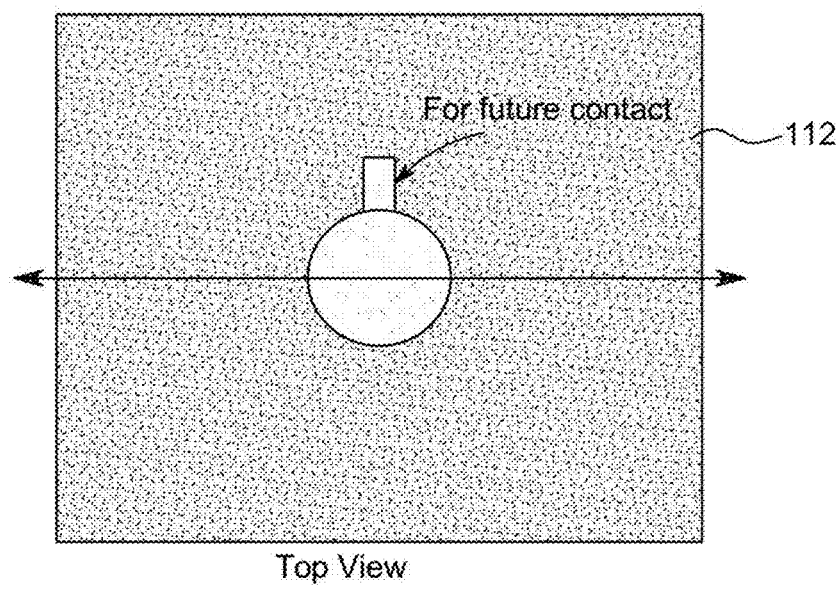
Figure 14A:
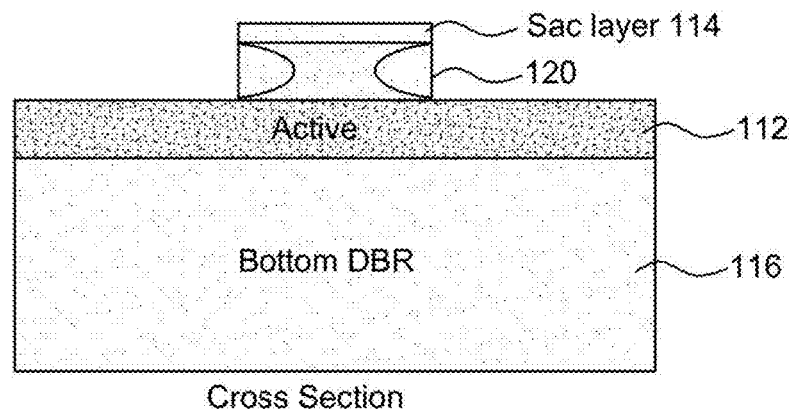
FIGS. 14A and 14B illustrate cross sections and top views of ALD wall protection for further selective etch on release, reliability, of the present invention.
Figure 14B:
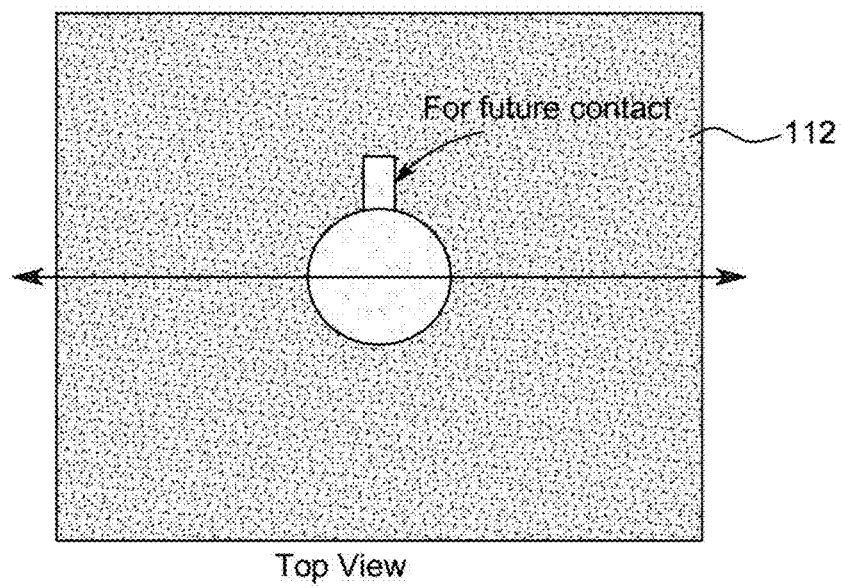

In one embodiment, implantation is done on a structure with the bottom DBR 116, active layer 112 and a thin sacrificial layer 114. The implantation is done on a layer between the active layer 112, and the sacrificial layer 114. An implant mask is used. The structure, including the bottom DBR 116, active layer 112, sacrificial layer 114 and mesa 122 position therebetween, is then dry etch down a very tiny mesa 122 for high-speed (radius of 5-10 μm), up to InP layers, close to a TJ interface FIGS. 13A and 13B. The mesa 122 having an increasing radius up to a top layer. Optical monitoring can be used. Referring to FIGS. 14A and 14B, atomic layer deposition (ALD) is performed only on side walls of etched post 110. This protects the etched post 110 from further release, increased reliability and isolation from surrounding air.

Figure 15A:
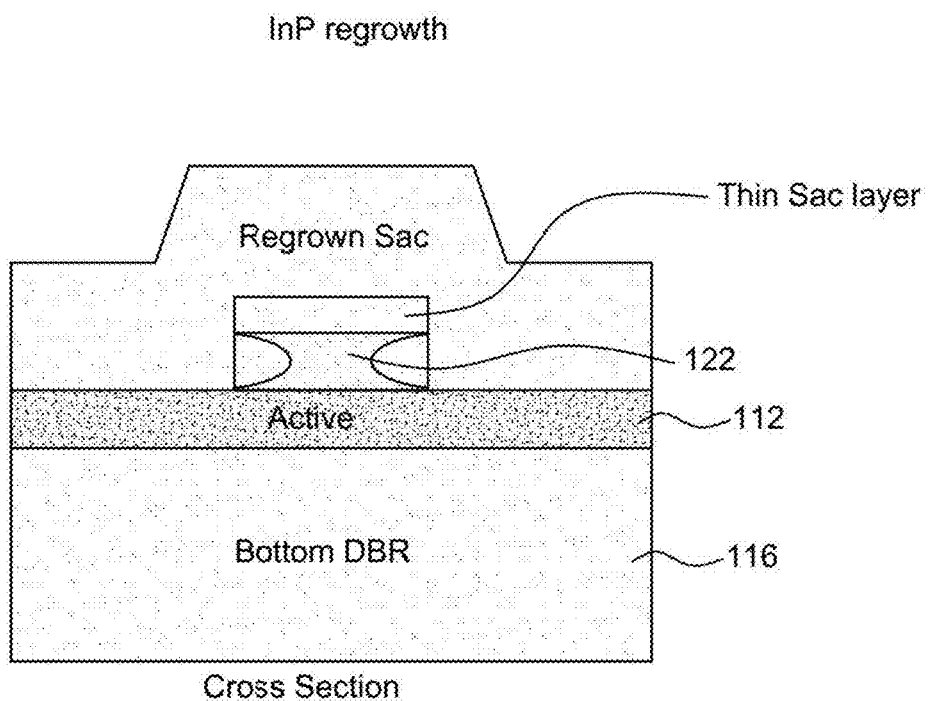
FIGS. 15A and 15B illustrate cross sections and top views of InP growth of the present invention.
Figure 15B:
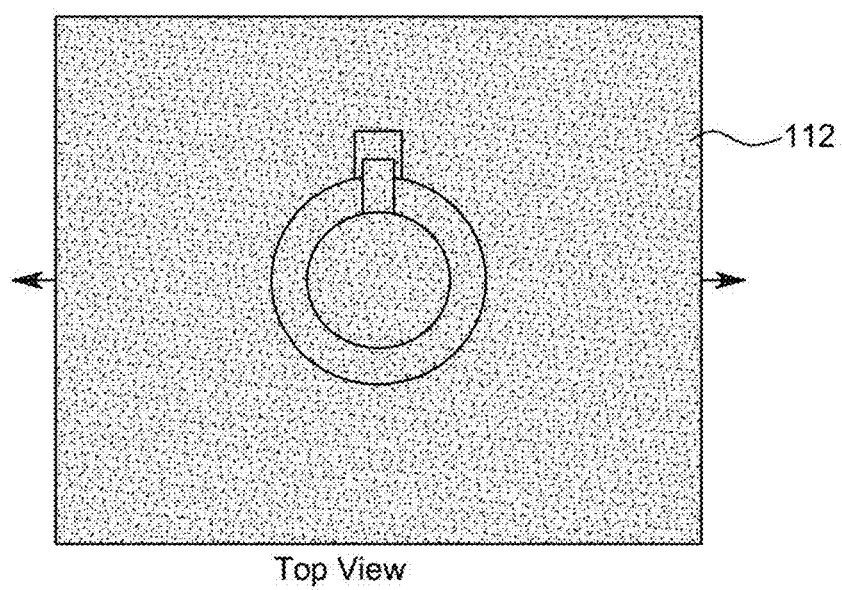

In one embodiment, illustrated in FIGS. 15A and 15B, ALD wall protection is used for further selective etch on release, and for reliability.

Figure 16A:
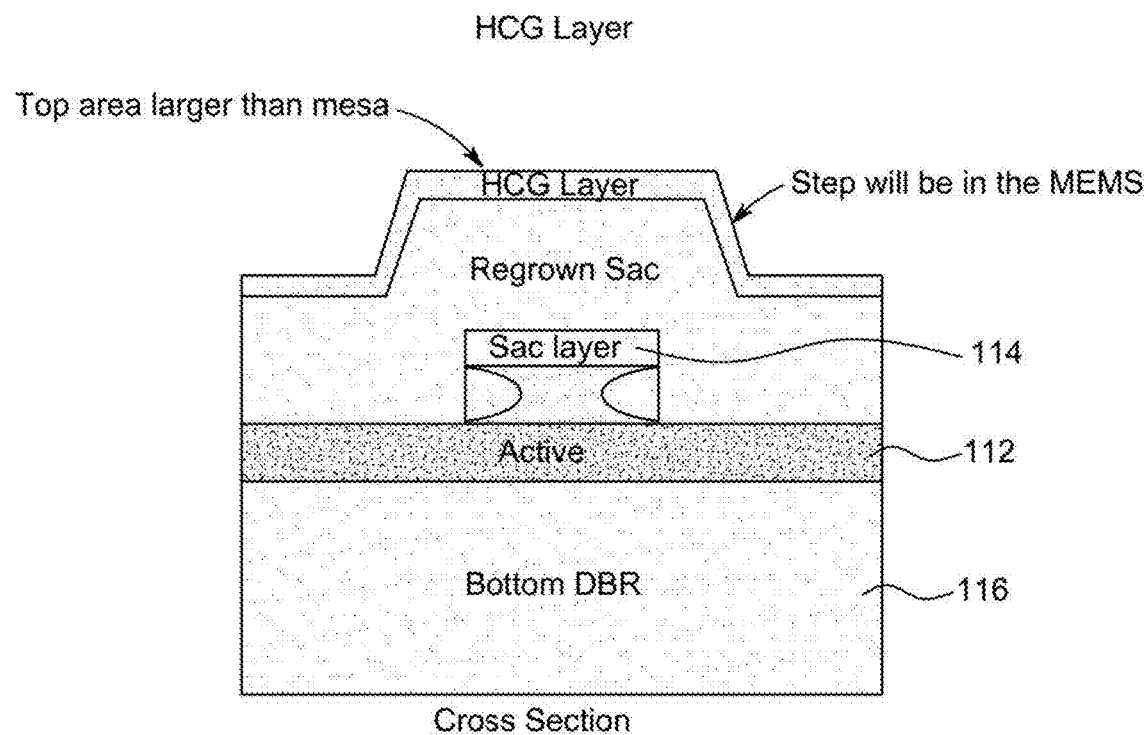
FIGS. 16A and 16B illustrate cross sections and top views of the HCG layer of the present invention.
Figure 16B:
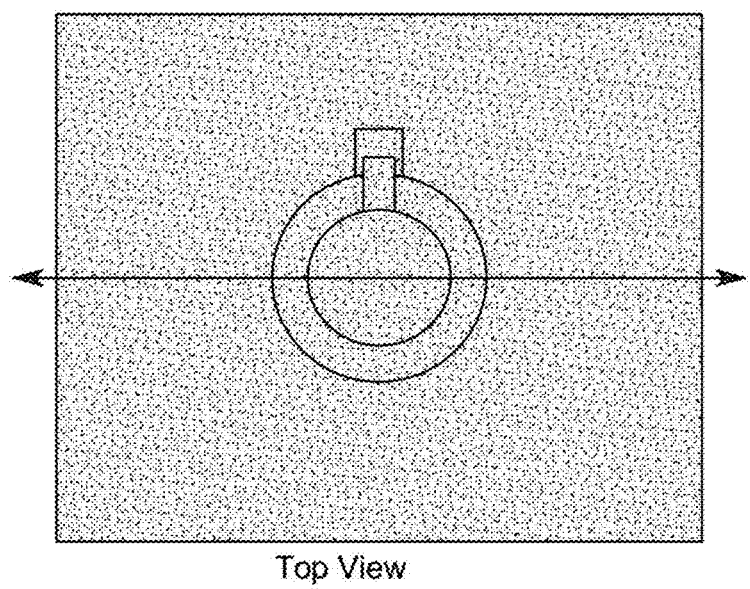

A full regrowth of a full sac layer+HCG on top is performed, as illustrated in FIGS. 16A and 16B, with the interface etched away. InP regrowth is a regrowth around the etched post 110. This is later removed, along with the sacrificial layer 114.

Figure 17A:
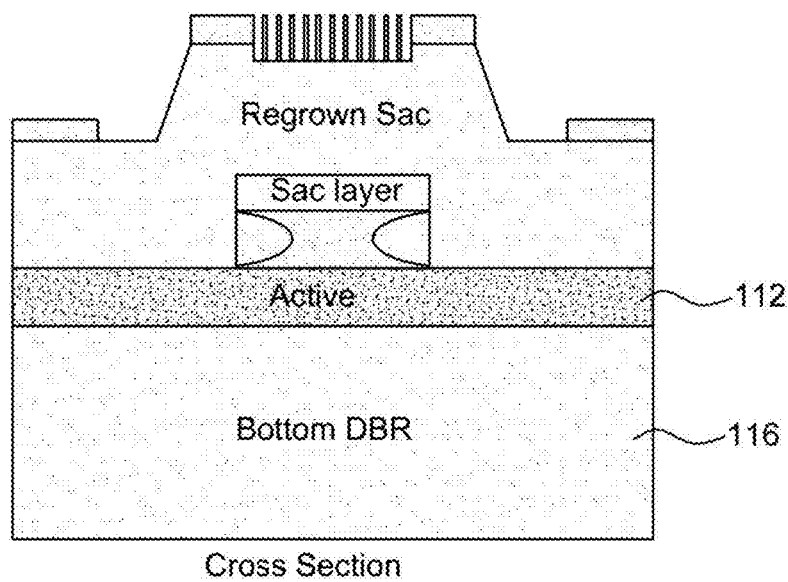
FIGS. 17A and 17B illustrate cross sections and top views of the HCG/MEMS litho/dry Etch of the present invention.
Figure 17B:
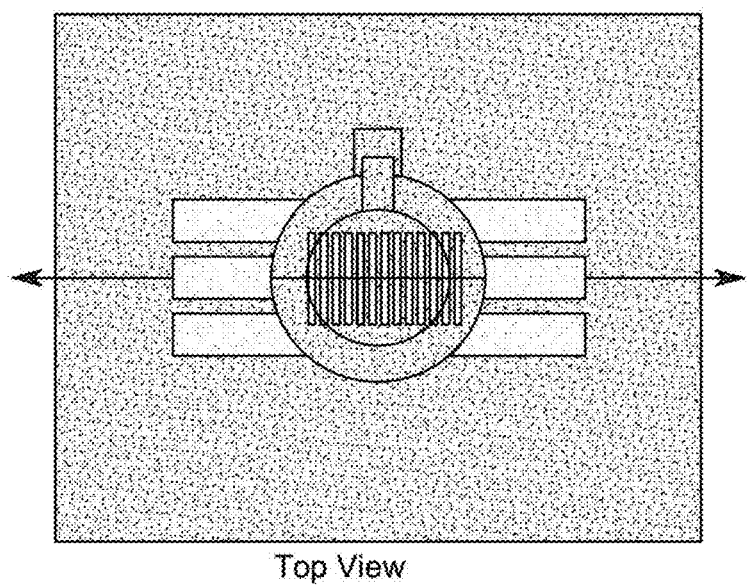

The regrowth interface is out of the optical/current paths. In one embodiment, the regrown layer, the new growing layers cause some defects on the crystal before arriving at the HCG layer. The structure includes the bottom DBR 116, active region (layer) 112, a thin sacrificial layer 114, a mesa 122 therebetween, and a regrowth sacrificial layer 114. In one embodiment, the mesa 122 grows laterally during regrowth for a slightly bigger than mesa 122 HCG, FIGS. 17A and 17B As a non-limiting example, a vertical step on the MEMS beams is not a problem. There is no need for implantation confinement.

Figure 18A:
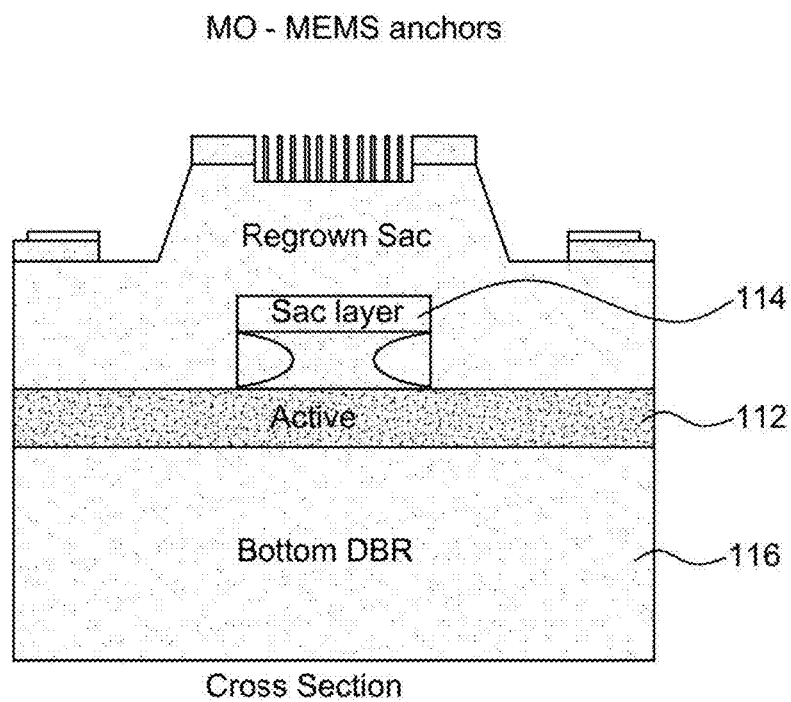
FIGS. 18A and 18B illustrate cross sections and top views of the MO-MEMs anchors, of the present invention.
Figure 18B:
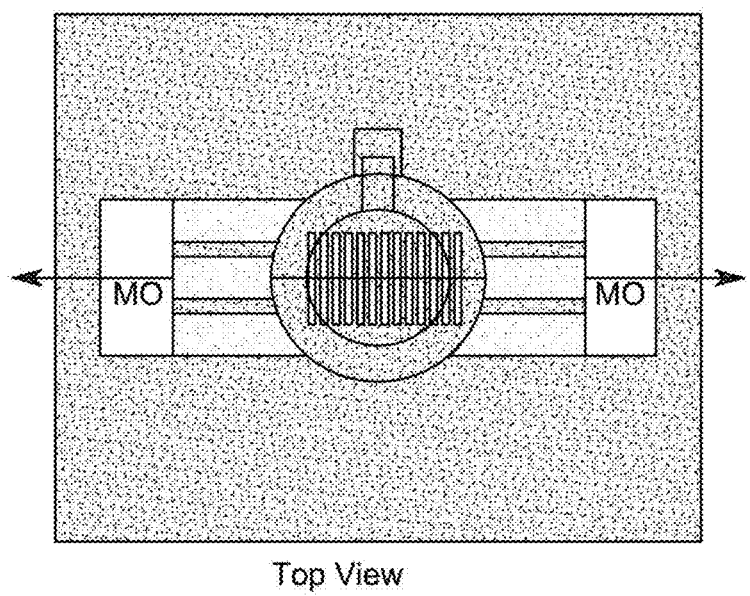
Figure 19A:
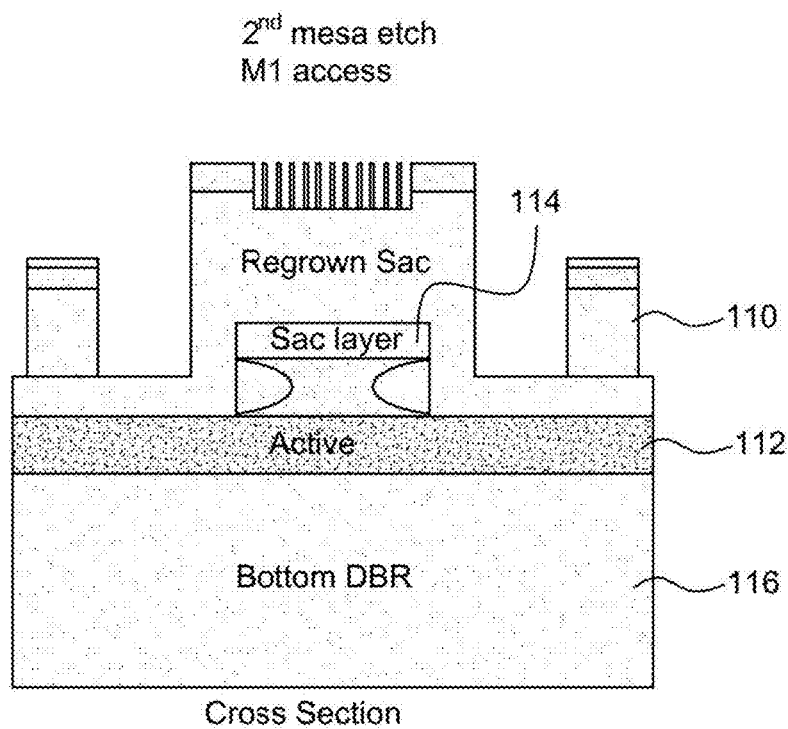
FIGS. 19A and 19B illustrate cross sections and top views of the second mesa etch, M1 access of the present invention.
Figure 19B:
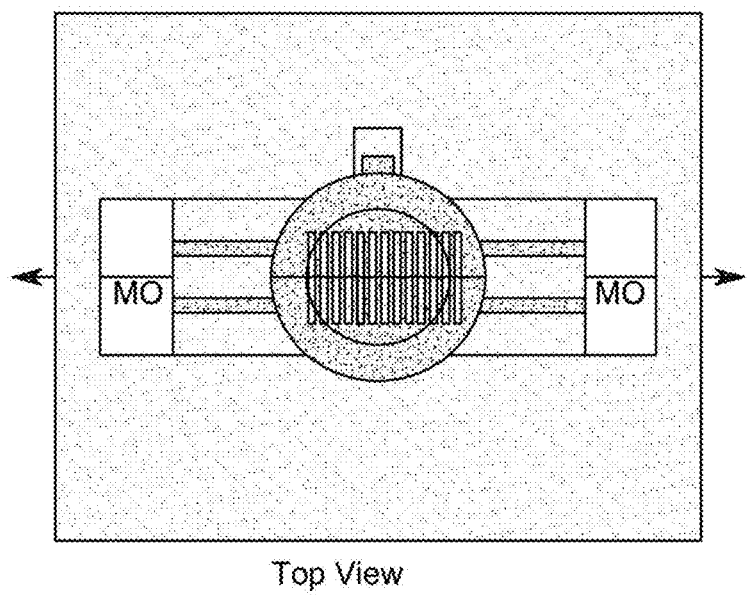
Figure 20A:
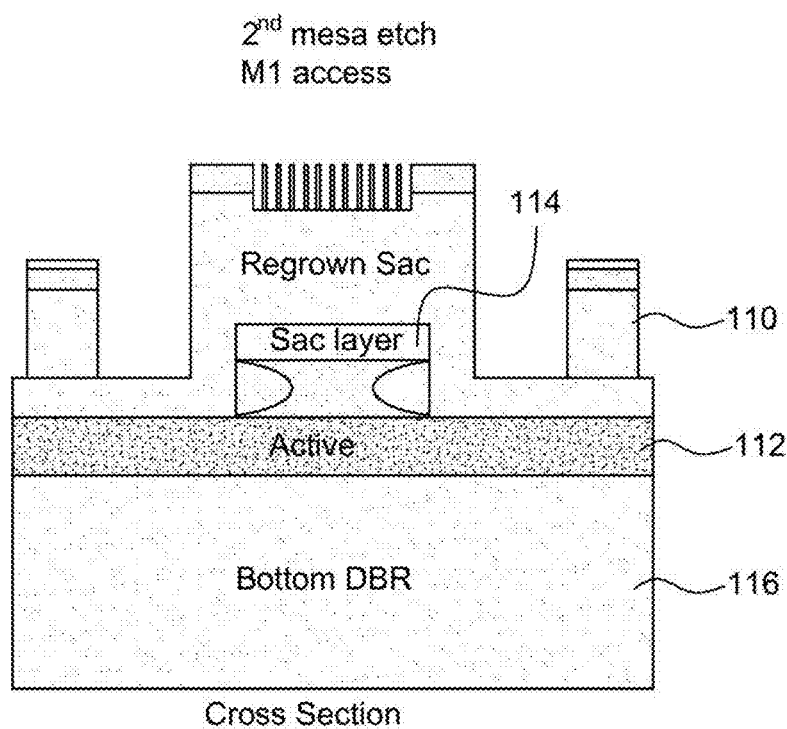
FIGS. 20A and 20B illustrate cross sections and top views of the second mesa etch, M1 deposit, of the present invention.
Figure 20B:
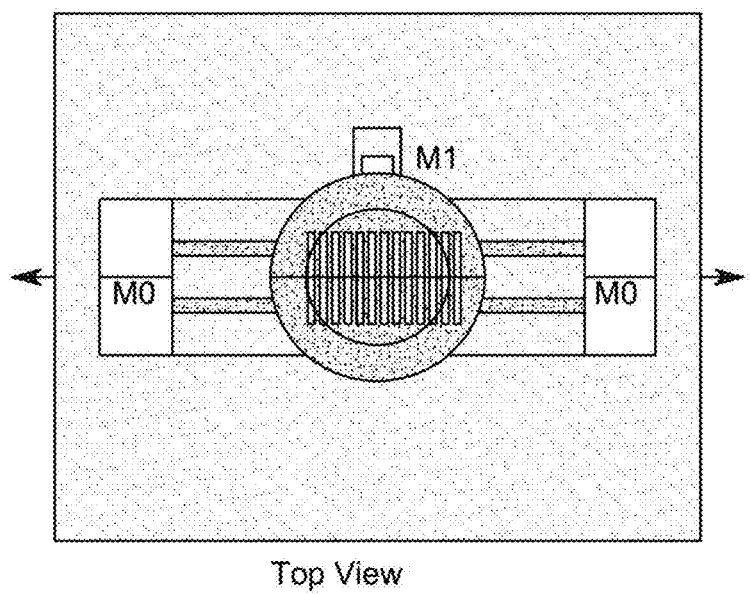

In one embodiment, mesa 122 confinement is provided, e.g, implantation is required only for contact isolation and current injection from the top of the mesa 122. In one embodiment, normal processing is completed for adding contact pads, which as a non-limiting example, the contact pads can be metal 3 and polyimide. MEMS anchors are on either side of the mesa 122, FIGS. 18A and 18B. In one embodiment, a second mesa etch is provides, FIGS. 19A and 19B, following by an MI cut, FIGS. 20A and 20B.

Figure 21A:
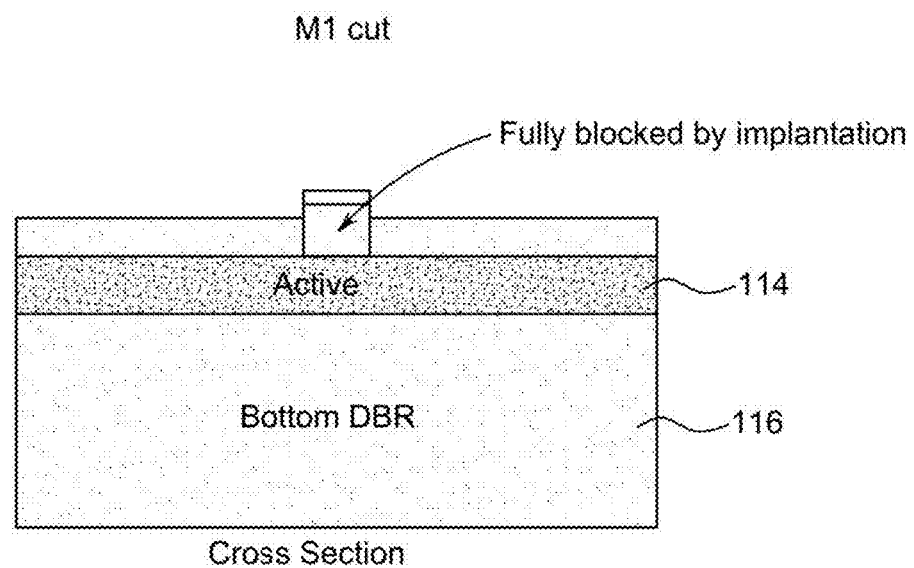
FIGS. 21A and 21B illustrate cross sections and top views of the M1 cut of the present invention.
Figure 21B:
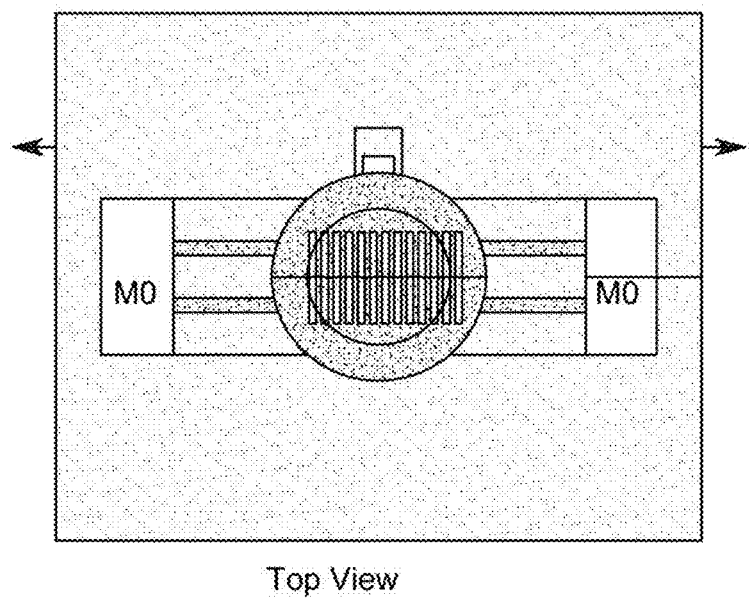
Figure 22A:
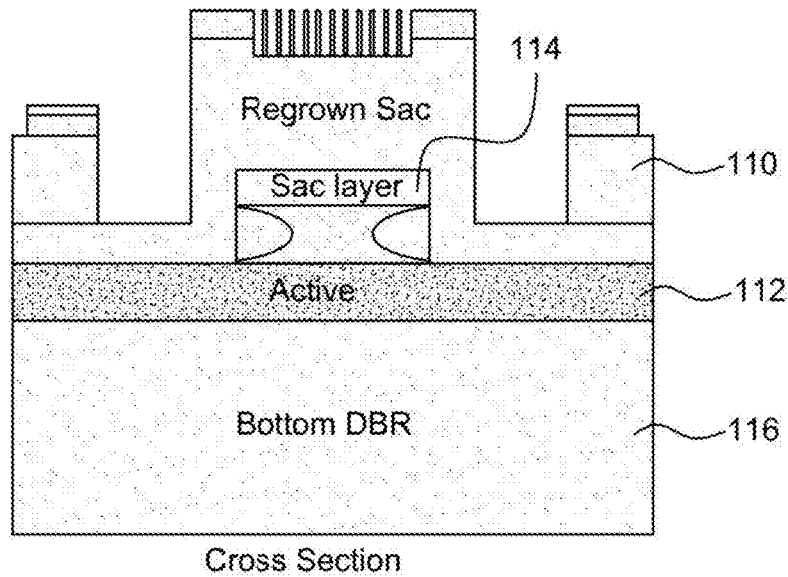
FIGS. 22A and 22B illustrate cross sections and top views of the M1 cut of the present invention.
Figure 22B:
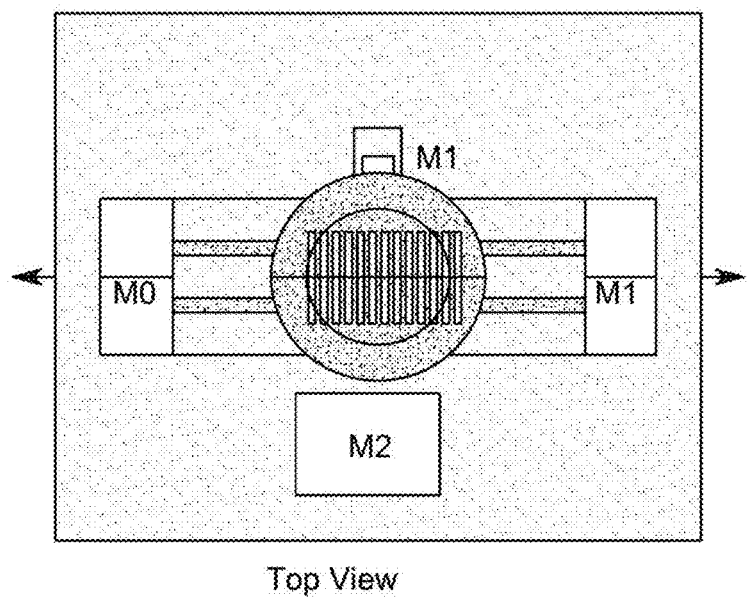

An opened access, M2, to the bottom DBR 116 contact is created, FIGS. 21A and 22B. This is followed by a release, FIGS. 22A and 22B. The release can be at the MEMS beams.

In one embodiment, the 38 of the VCSEL laser has a long wavelength, including but not limited to from 0.720 micron to 1.7 microns, and in one instance, 1.365 microns.

In one embodiment, VCSEL 10 products an output beam with a wavelength of 1550 nm is chosen due to its high signal-to-noise ratio (SNR) for glucose signals.

In one embodiment, the output 38 of the VCSEL laser is a long wavelength, at least partially created from indium phosphide structure or material in the VCSEL laser 10. As a non-limiting example, VCSEL laser 10 can include an indium phosphide substrate 46, or a substrate 46 that at least partially includes indium phosphide.

In one embodiment, VCSEL laser 10 is coupled to or includes a top DBR 42 or high contrast grading (HCG) 34. As a non-limiting example, bottom DBR 12 is a semiconductor DBR or a combination of a semiconductor DBR with a dielectric coating. In this manner, VCSEL 10 can include a dielectric coating. As a non-limiting example, the dielectric coating improves a broadening of a tuning range of the VCSEL laser 10.

In one embodiment, VCSEL laser 10 operates in a single mode or a multi-mode operation. As a non-limiting example, dimensions of the aperture and HCG 34 are contributing factors to the single mode operation.

In one embodiment, VCSEL laser 10 can deploy multiple tunnel junctions to enhance the output 38 of VCSEL laser 10.

As a non-limiting example, buried tunnel junctions (BTJ) improve an energy efficiency of VCSEL laser 10.

As a non-limiting example, a wavelength of the VCSEL laser output 38 can be swept to provide improved resolution. In one embodiment, the VCSEL laser output 38 is swept by modulating an HCG grading 34 up and down, e.g, its up and down movement relative to a top of VCSEL laser 10, wherein when the HCG 34 moves closes to non-extended portion relative to a top of VCSEL laser 10, a wavelength of the output 38 changes and returns closer to an original output 38 of the VCSEL laser, without extension of the grading.

In one embodiment, a mem's structure is coupled to the HCG grading 34 or top DBR 42 to create a swept source. As a non-limiting example, modulating a VCSEL laser output 38, in combination with a sweeping of wavelengths of the VCSEL laser output 38 allows for higher resolution and reduces at least a portion of atmospheric interference of VCSEL laser operation.

In one embodiment, multiple tunnel junctions increase an optical power of the VCSEL laser 19. These junctions are provided in a body of the VCSEL laser 10.

In one embodiment, a semiconductor is included with a modulator to allow a swept source to be modulated. As a non-limiting example, the modulation of the VCSEL laser turning the VCSEL laser on and off. As a non-limiting example, the modulation is from about 1 to 50 G. In another embodiment, the modulation is greater than 50 G.

As a non-limiting example, an optical photonic integrated circuit (PIC) is coupled to the VCSEL laser. The VCSEL laser can be mounted on the PIC. In one embodiment, a plurality of VCSEL lasers are mounted on the PIC.

In one embodiment, HCG 34 acts as a partial mirror. As a non-limiting example, HCG 34 can operate as a second mirror HCG 34 is positioned at the top of the vertical resonator cavity 32, following removal of at least a portion of the sacrificial layer 44. HCG 34 is positioned at the top of the vertical resonator cavity 32. As a non-limiting example, HCG 34 is positioned on a top of the mesa. in one embodiment, a plurality of support elements, anchors, hold HCG 34 in place. HCG 34 then moves, typically up and down relative to cavity 32.

Two or more support elements are provided. Support elements provide support for HCG 34. As a non-limiting example, support elements can have dimensions of 50 microns long, one micron wide. Their thickness is determined by a growth of HCG 34 layer. Superficial layer 44 is defined by epitaxial growth. As a non-limiting example, HCG deformation is provided under different points of operation. For broad tuning, HCG 34 deforms and moves away from cavity 32. A period and duty cycle of HCG 34 are determined by the amount of deformation. As a non-limiting example, a thickness of support elements define their function. A modification of support elements occurs when there is an actuation. This causes support elements to bend and HCG 34 deforms. In one embodiment, the support elements 45 are not straight beams. In various embodiments, there can be variations of support elements to modify HCG 34 deformation.

A good portion of sacrificial layer 44 is substantially removed, at least a portion creating anchors for HCG 34.

As a non-limiting example, a main actuation of HCG 34 can include but not be limited to: electrooptic, with an application of voltage across the surface of HCG 34, thermal, piezoelectric and the like. an air gap is between the top surface of vcsel laser 10 and HCG 34. Top DBR is not necessary.

When a voltage is applied, anchors do not allow current to flow over and cause HCG 34 to move. This creates charging between HCG 34 and the mesa 122. When voltage is increased, an attraction vis electro static actuation can be increased. As a non-limiting example, actuation is achieved with piezoelectric, thermal and the like. This provides tuning that depends of the wavelength and power. In one embodiment, tuning up to 100 nm is provided.

In one embodiment, electrostatic actuation is used by application of a voltage

As a non-limiting example, less than 1% of the output beam is emitted from VCSEL laser 10.

The remaining portions of sacrificial layer 44 not removed provide anchoring points for HCG 34. As a non-limiting example, portions of the sacrificial layer 44 remain to provide anchoring in order for HCG 34 to move.

There can be two or more support elements coupled to a remaining portion of sacrificial layer 44. In one embodiment, four support elements are provided. Different directions of moving HCG 34 are provided. In various embodiments, HCG 34 can have a variety of different geometries, including but not limited to hexagonal, octagonal, a double frame design and the like.

In one embodiment, the output 38 of the VCSEL laser has a long wavelength, including but not limited to from 1 micron to 1.7 microns, and in one instance, 1.365 microns.

In one embodiment, the output 38 of the VCSEL laser is a long wavelength, at least partially created from indium phosphide structure or material in the VCSEL laser 10. As a non-limiting example, VCSEL laser 10 can include an indium phosphide substrate, or a substrate that at least partially includes indium phosphide.

In one embodiment, VCSEL laser 10 is coupled to or includes a top DBR 42 or high contrast grading (HCG) 34.

As a non-limiting example, bottom DBR 12 is a semiconductor DBR or a combination of a semiconductor DBR with a dielectric coating. In this manner, VCSEL 10 can include a dielectric coating. As a non-limiting example, the dielectric coating improves a broadening of a tuning range of the VCSEL laser 10.

In one embodiment, VCSEL laser 10 operates in a single mode or a multi-mode operation. As a non-limiting example, dimensions of the aperture and HCG 34 are contributing factors to the single mode operation.

In one embodiment, VCSEL laser 10 can deploy multiple tunnel junctions to enhance the output 38 of VCSEL laser 10.

As a non-limiting example, buried tunnel junctions (BTJ) improve an energy efficiency of VCSEL laser 10.

As a non-limiting example, a wavelength of the VCSEL laser output 38 can be swept to provide improved resolution. In one embodiment, the VCSEL laser output 38 is swept by modulating an HCG grading 34 up and down, e.g, its up and down movement relative to a top of VCSEL laser 10, wherein when the HCG 34 moves closes to non-extended portion relative to a top of VCSEL laser 10, a wavelength of the output 38 changes and returns closer to an original output 38 of the VCSEL laser, without extension of the grading.

In one embodiment, a mem's structure is coupled to the HCG grading 34 or top DBR 42 to create a swept source. As a non-limiting example, modulating a VCSEL laser output 38, in combination with a sweeping of wavelengths of the VCSEL laser output 38 allows for higher resolution and reduces at least a portion of atmospheric interference of VCSEL laser operation.

In one embodiment, multiple tunnel junctions increase an optical power of VCSE 10. These junctions are provided in a body of the VCSEL laser 10.

In one embodiment, semiconductor amplifier, ("SOA)" 200 is included with a modulator to allow a swept source to be modulated. As a non-limiting example, the modulation of the VCSEL laser turning the VCSEL laser on and off. As a non-limiting example, the modulation is from about 1 to 50 G. In another embodiment, the modulation is greater than 50 G.

In one embodiment, illustrated in FIGS. 23(*a*) and 23(*b*), SOA 200, with or without an optical fiber, includes tunable VCSEL 10, a cooler 210, first heatsink 212, ASIC or driver controller 214, a thermistor 216, one or more lenses 218, one or more optical isolators 219, one positioned at a front of tunable VCSEL 10 and the second at a front of SOA 200, beam splitters 222, monitor 224, balance detectors 226, photodiode monitors 227, optical bench 228, a second thermal electric cooler 230, and a second heatsink 231. As a non-limiting example, the semiconductor optical amplifier 200 is configured to be coupled to an optical fiber 229. Also provided is a K-clock 233.

First cooler 210 provides precise control of temperature for the tunable VCSEL 10 for precision wavelength control. As a non-limiting example, cooler 210 can be a thermal electric cooler 210. Cooler 210 provides cooling to all or a portion of SOA 200. First heatsink 212 removes heat from cooler 210. Driver controller 214 provides control for a plurality of different parameters of SOA 200 including but not limited to: sweep control of tunable VCSEL 10 for wavelength use and selection, controlling temperature of SOA 200 and tunable VCSEL 10, feedback of the K-clock 233, thermistor 216 and the like to measure temperature. The one or more lenses 218 focus output beam 38. Optical isolator 220 receives polarized output beam 38 rotates it, and reduces and/or prevents all or a portion of polarized output beam reflecting back into tunable VCSEL 10 and SOA 200. Beam splitter 222 splits output beam 38. Monitors 224, which can be a photo-diode monitor, monitors power of output beam 38. As a non-limiting example balance detector 226 and optical bench 228 provide support and stability for SOA 200. Second cooler 230 cools SOA 200. SOA 200 is cooled while maintaining high temperature control of VCSEL 10. Cooler 200 provides temperature control of tunable VCSEL 10. Cooler 230 provides temperature control of SOA 200. As non-limiting examples, temperature are controlled for a variation in temperature of plus or minus 0.1 degrees for tunable VCSEL 10, and 1 degree variation for SOA 200. As a non-limiting example, SOA 200 is configured to be coupled to optical fiber 229.

As a non-limiting example, a MEMS-VCSEL 10 swept laser source emits a continuous optical spectrum by rapid modulation of the laser's cavity length using a tunable end mirror. In this embodiment, different wavelengths are not emitted simultaneously, but sequentially, according to the position of the MEMS mirror. A sweep denotes the movement of the mirror from one end of its travel range to the other. Hence, the terms "Wavelength Sweep Range" and "Optical Bandwidth" denote the optical spectrum emitted by the laser during one full sweep. This range of wavelengths is represented by Δλ. The optical bandwidth is defined as the spectral width at −10 dB attenuation, or the wavelength difference between spectral positions where the intensity is 10% of the maximum intensity.

A MEMS-VCSEL swept laser 10 can include a fiber-optic Mach-Zehnder Interferometer (MZI) with balanced detection of both interferometer outputs.

In one embodiment, The ASCI controls the feedback loop of the output of SOA 200 VCSEL as it tunes across the different wavelengths. In one embodiment, the ASIC provides the intelligence that holds the firmware and provides processing from the sensors including but not limited to: (MPD for (monitoring power), thermistor 216 for (temperature), wavelength locker (for being on grid) k-clock (linearization for different sweep rates), and the like. As a non-limiting example, the ASIC replace a variety of different discrete components Different pulse shapes are put in to linearize the VCSEL sweep. As a non-limiting example, VCSEL 10 and SOA 200 can be flattened as the diode is swept. VCSEL 10 and SOA 200 have different gain curves. The optical elements have different absorption properties as well so as you move blue in the spectrum the isolators become very absorptive.

The one or more lenses 218 focus output beam 38. Optical isolator 220 receives polarized output beam 38 rotates it, and reduces and/or prevents all or a portion of polarized output beam reflecting back into tunable VCSEL 10 and SOA 200. Beam splitter 222 splits output beam 38. Monitors 224, which can be a photo-diode monitor, monitors power of output beam 38. As a non-limiting example balance detector 226 and optical bench 228 provide support and stability for SOA 200. Second cooler 230 cools SOA 200. SOA 200 is cooled while maintaining high temperature control of VCSEL 10. Cooler 200 provides temperature control of tunable VCSEL 10. Cooler 230 provides temperature control of SOA 200. As non-limiting examples, temperature are controlled for a variation in temperature of plus or minus 0.1 degrees for tunable VCSEL 10, and 1 degree variation for SOA 200. As a non-limiting example, the semiconductor optical amplifier 200 is configured to be coupled to optical fiber 229.

In one embodiment, ASCIC 214 controls the temperature of coolers 200 and 230. This provides swept source for drive to tunable VCSEL 10, and supplies the drive to SOA 200 as well as a feedback loop from K-clock 233. The feedback loop provides for linearization It allows sweep rates to be changed and optimizes power out into SOA 200, as well as flattening SOA power out-put.

As a non-limiting example, K-clock 233 provides a sweeping of tunable VCSEL 10 as a non-linear function, a square root. The K-clock 233 provides a feedback loop of a sweeping of tunable VCSEL sweeping, to provide linearly of tunable VCSEL 10 sweep. A variety of K-clocks can be used, including but not limited to a free space K-clock, and fiber based K-clocks. In one embodiment, a fiber k-clock has to be tailored to the sweep rate such as 200 kHz or 30 kHz.

Figure 23A:
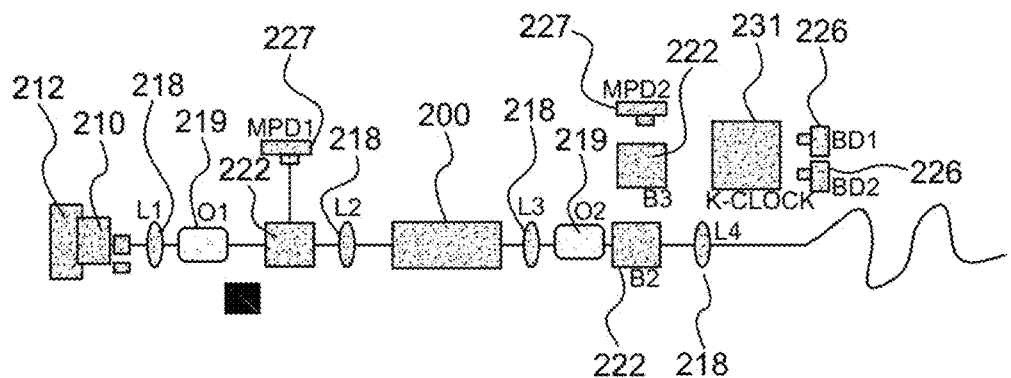
FIGS. 23A, 23B and 23C illustrate one embodiment of a semiconductor optical amplifier of the present invention.
Figure 23B:
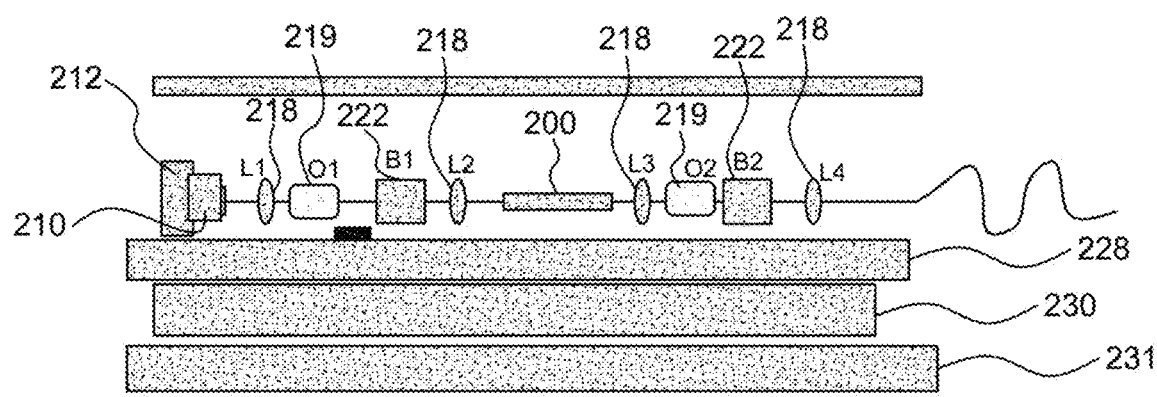
Figure 23C:
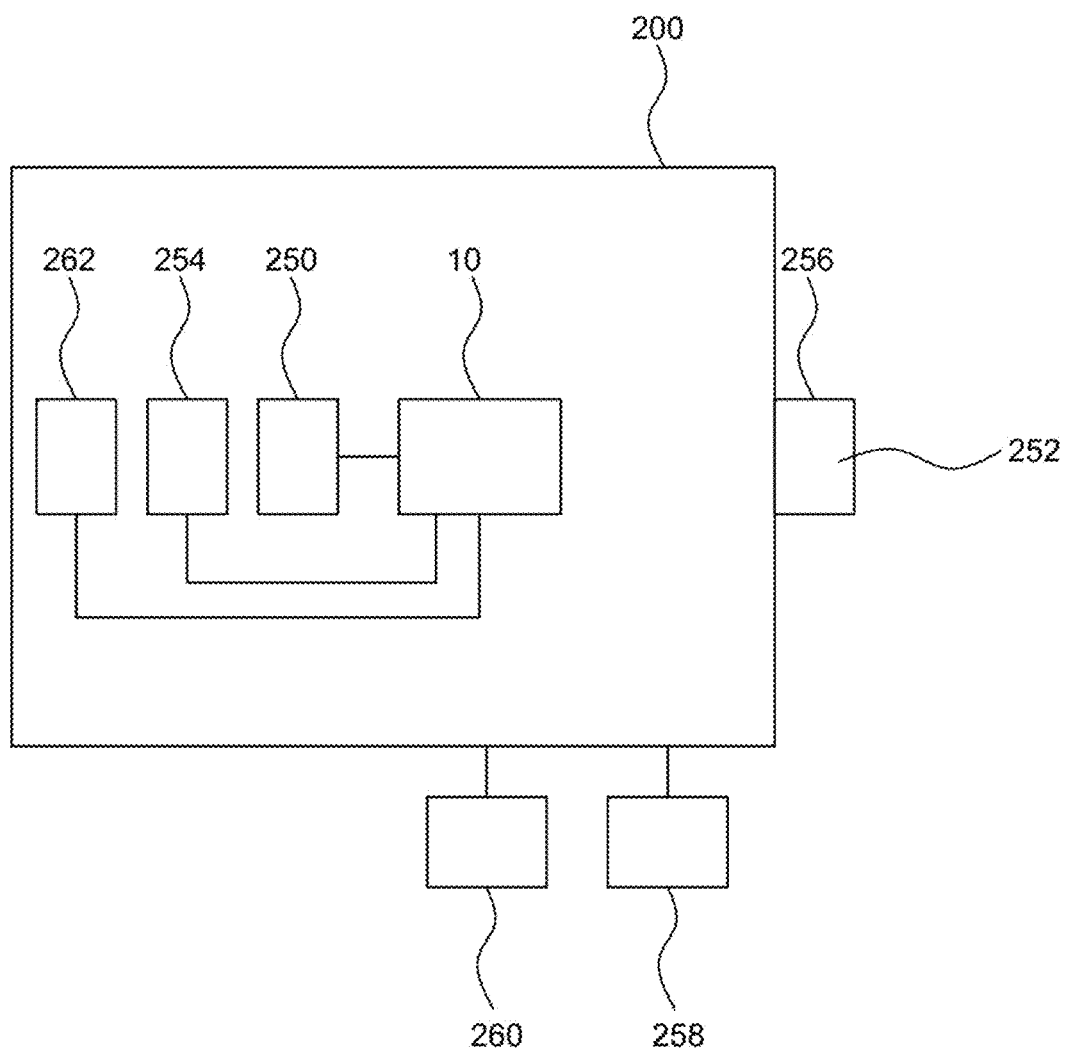

As illustrated in FIG. 23C SOA 200 can include: an optical isolator 248 positioned at an exterior of VCSEL 10; an optical isolator 250 positioned at an exterior of VCSEL 10 at a front of VCSEL 10; a polarization maintaining optical fiber 252 coupled to SOA 10; thermistor 216 with the TEC for the temperature control loop; a detector 254 at an output VCSEL 10 and a detector 256 at an output of SOA 200 configured to monitor optical power; a photo detector 254 at the output of VCSEL 10 and a detector 256 at the output of SOA 200 configured to flatten a power curve of SOA 200; at least one of: a wavelength locker 258 coupled to SOA 200; or a wavelength calibration spike filter 260, configured to provide wavelength control and an exact wavelength reference; and a wavelength locker 256 coupled to SOA 200; and spike filter 260, integrated as an optical photonic integrated circuit (PIC) to assist in miniaturization.

In one embodiment, a photodiode monitor 262 is coupled to the VCSEL The photodiode monitor can include a photodiode, K-clock and a wavelength locker 258.

Swept-source optical coherence tomography (SS-OCT) enables depth-resolved interferometric imaging based on frequency-swept light sources. It has a number of attractive features compared to the time-domain OCT (TD-OCT) or spectral-domain OCT (SD-OCT) technologies. It can provide a higher imaging speed in keeping fine resolutions and good sensitivity. It can easily work with a balanced photodetector which greatly reduces annoying imaging artifacts coming from common-mode noise components. The long-wavelength bands that low-cost silicon image sensors do not support in SD-OCT can be better utilized by SS-OCT for deeper penetration depths in tissue. SS-OCT is also superior in getting long axial ranges of imaging above 5 or more centimeters. Because of those features, SS-OCT has become one of the most promising optical modalities for medical imaging applications.

Continuously or nearly continuously swept source changes its optical frequency of the laser in a sweep. The sweep characteristics are evaluated by a number of factors including the speed, range, implementation cost, sweep linearity and repeatability. In most cases, swept source produces an undesirable nonlinear relation of time to optical frequency and may need OCT signal reassignments for best resolution performance. At the same time, the time-to-frequency relation may exhibit sweep-to-sweep variations which result in uncertainty of frequencies for acquired signals of spectral interferogram. The properties of the inter-sweep variations are subject to the sweeping mechanism. Inside swept source, the frequency sweep is driven by tunable filtering, cavity-length tuning or chromatic dispersion dynamics. It can be enabled by a mechanical motion, electric current modulation or a passive dispersive element. For swept sources based on electric tuning or dispersion dynamics, relatively stable operation is expected. But the most widely used types of swept sources have internal mechanical motions and inevitably produce operational instability. For such a swept source, the instable sweep characteristic is one of major sources of phase instability observed in final OCT data.

As a non-limiting example, ASIC 214 does not replace K-clock 233. As a non-limiting example, ASIC 214 is basically a processor with a customized. K-clock 233 monitoring the output of the light pulse over wavelength. As voltage is added to the MEMs it moves less to start with, and it moves more with higher voltages. It is not linear in the wavelength sweep. By using K-clock 233 the nonlinear sweep of the wavelength is corrected. This is particularly useful in optical coherent tomography (OCT) applications as well as for other applications. As a non-limiting example, the pulse shape is controlled by the ASCI 214, shaping it to create a linear wavelength output.

Depending on the application, different sensors are used, including but not limited to: K-clock 233, wavelength locker 258, spectrometer, and the like. In one embodiment, ASIC 214 holds the firmware and provides processing from the sensors ie (MPD for (monitoring power), thermistor (temperature), wavelength locker 258 (for being on grid) K-clock 233 (linearization for different sweep rates). As a non-limiting example, ASIC 214 replaces a plurality of discrete components.

Optical coherence tomography (OCT) is a non-invasive imaging technique that provides detailed cross-sectional pictures of the retina, which is the light-sensitive tissue lining the back of the eye. OCT uses light waves to create these images, similar to how ultrasound works but with light instead of sound waves. It captures reflections from within the eye tissue, allowing it to generate precise cross-sectional views. In various embodiment, OCT: allows an ophthalmologist can visualize distinctive layers of the retina, these layers include the macula, which is crucial for central vision; by measuring the thickness of these layers, OCT aids in diagnosis and guides treatment. In various embodiments, OCT is used is a variety of applications, including but not limited to: glaucoma, monitoring changes in the optic nerve fibers caused by glaucoma; age-related macular degeneration (AMD), by assisting in assessing retinal health and detecting fluid or deformities; diabetic eye disease, evaluating the retina for signs of diabetic retinopathy, and the like.

During OCT, an ophthalmologist uses the beam from SOA 200 to scan an area of a patient's eye. The OCT device then measures the light that the structures within the eye have reflected back. Thereafter, the OCT device uses these measurements to create images of a patient's retina that are cross-sectional and three-dimensional.

Figure 23D:
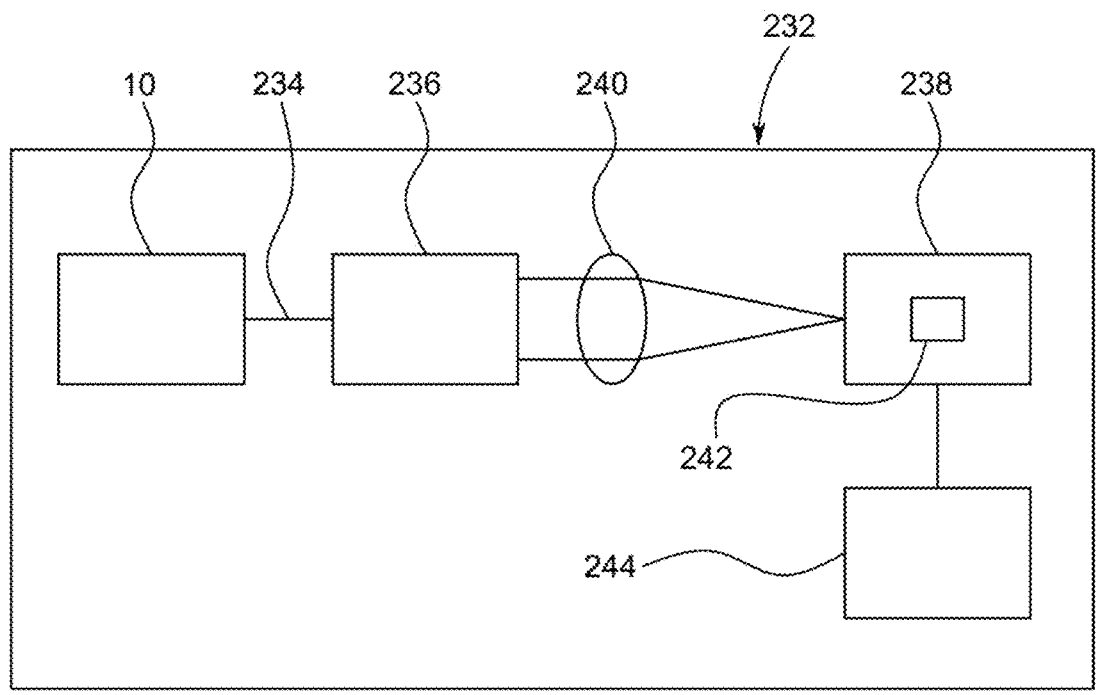
FIG. 23D illustrates one embodiment of a system for optical coherence tomography of the present invention.
Figure 24:
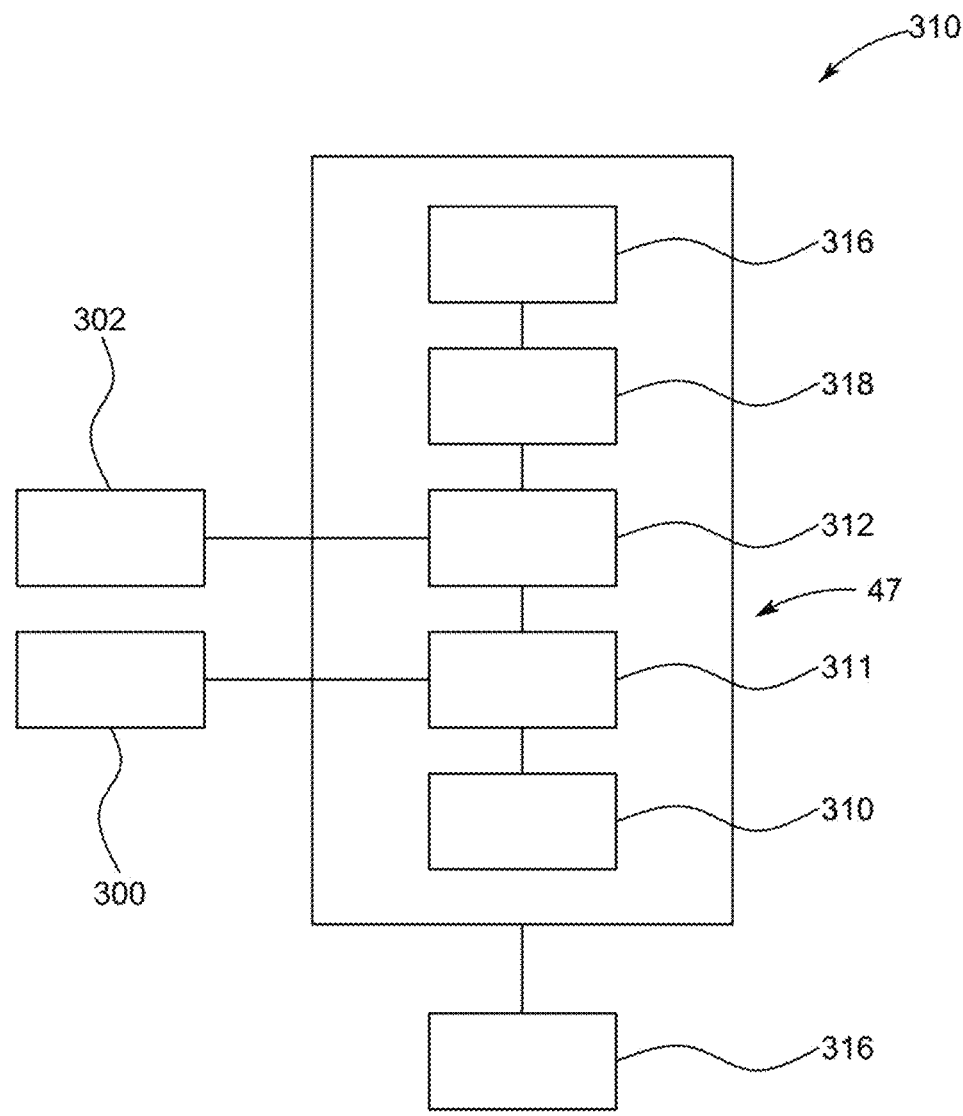
FIGS. 24-27 illustrate various embodiments for the use of artificial intelligence (AI) with VCSEL amplifiers of the present invention.
Figure 25:
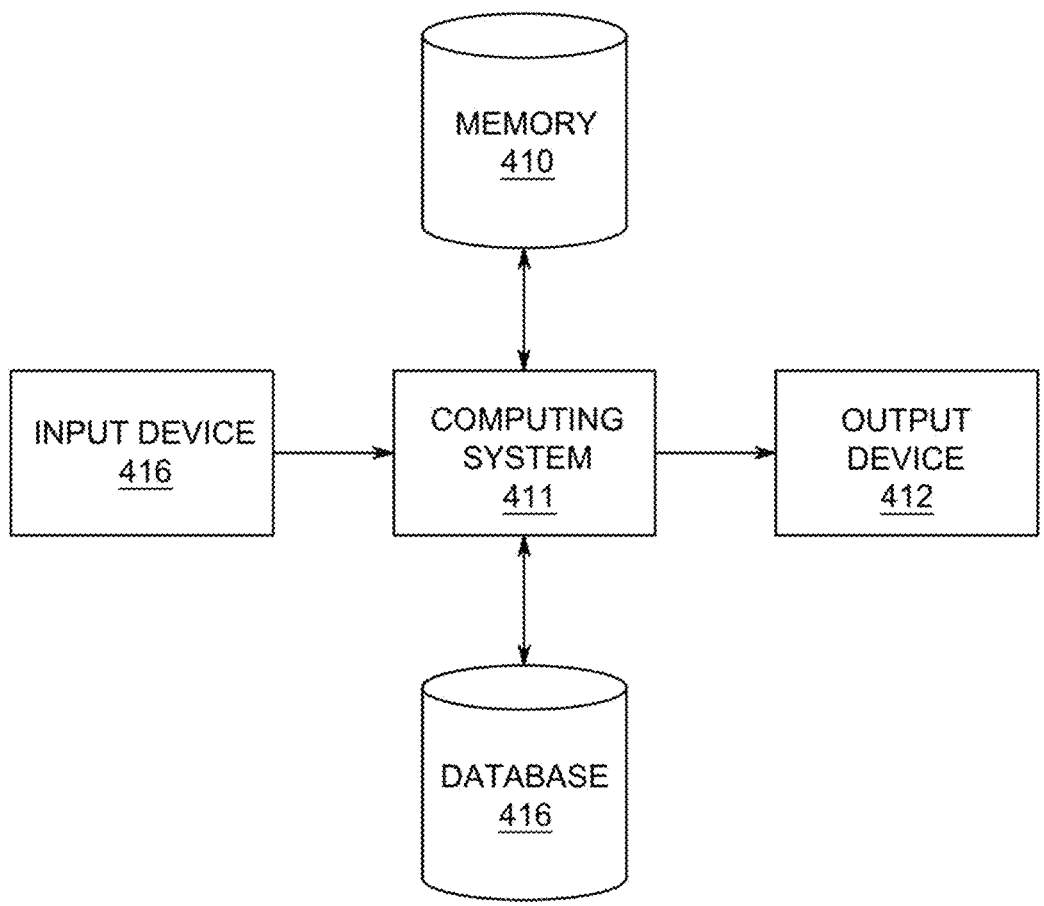
Figure 26:
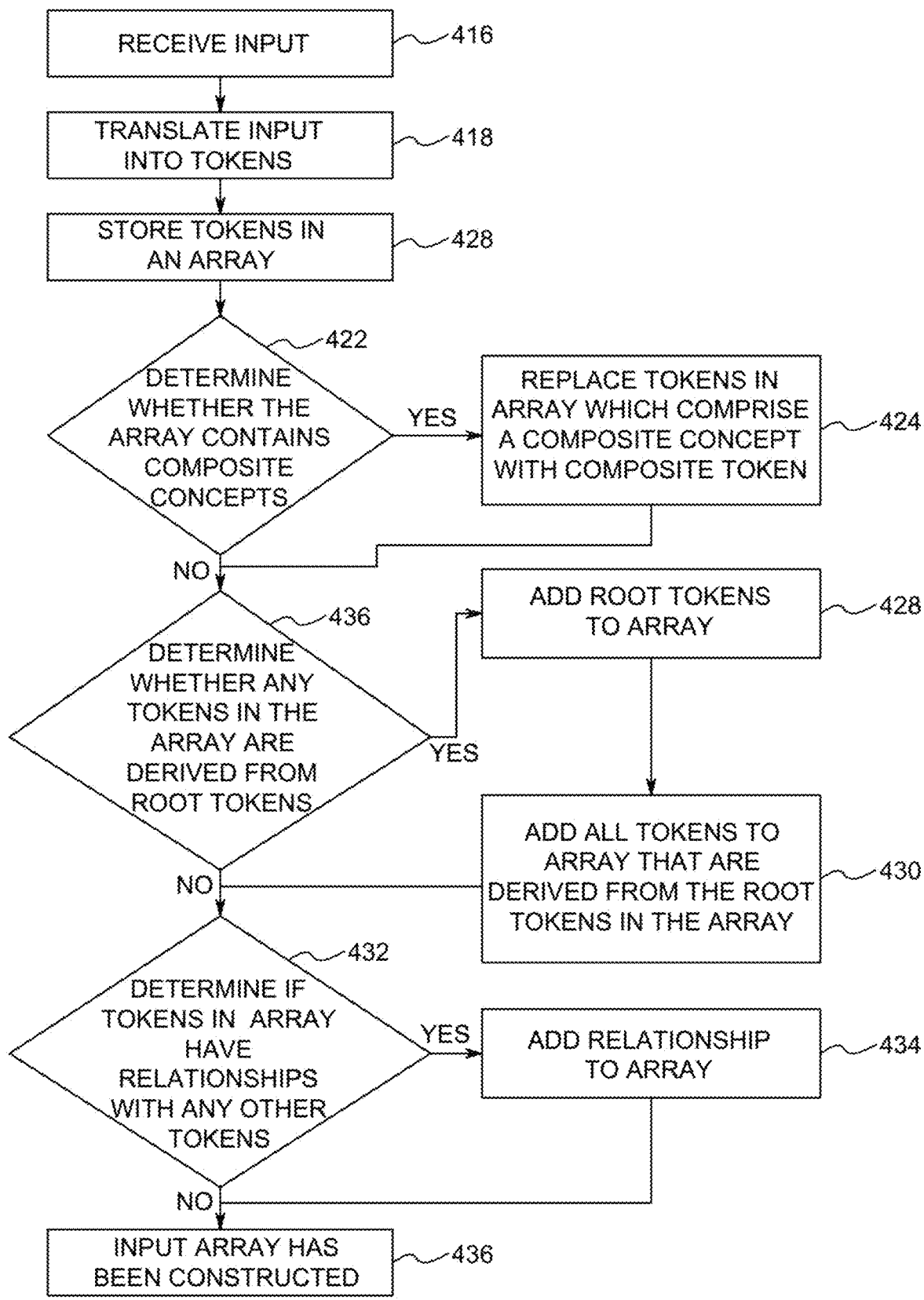
Figure 27:
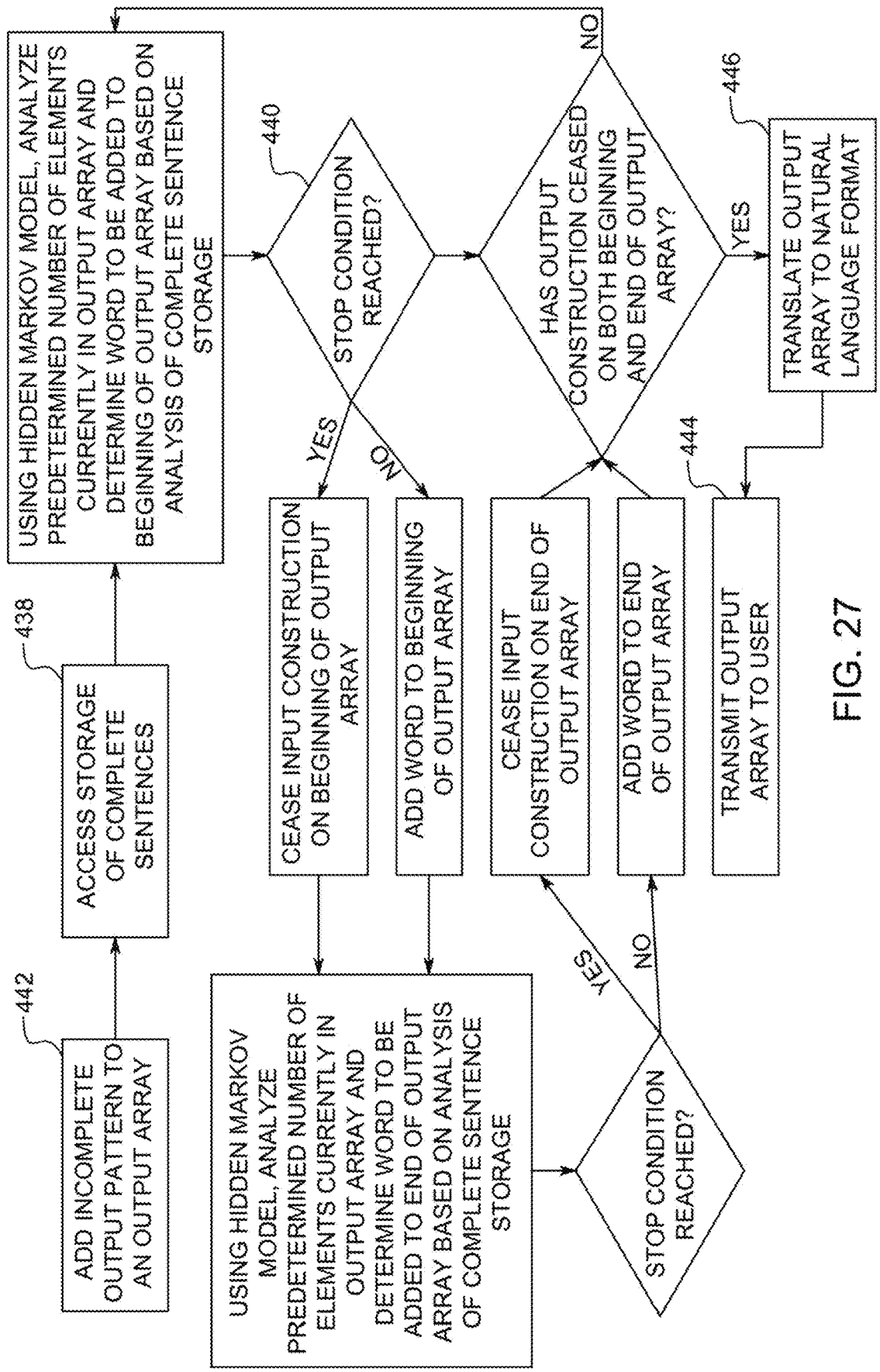

As illustrated in FIG. 23D a system for optical coherence tomography 232 includes a source of optical radiation 10, an optical fiber 234; an interface medium 236 at a distal end of the optical fiber 234, the optical fiber 234 having a core providing a common path for optical radiation from the source of optical radiation 10 reflected from the interface medium 236 and a target 238 such as an eye; a lens 240 in optical contact with the interface medium 236, the lens 240 configured to focus optical radiation through a side-opening window to a focal point 242 in the target 238, wherein a beam diameter at the focal point is between 10 and 60 microns; receiving electronics 244 configured to receive the optical radiation reflected from the interface medium 236 and the target 238; and a processor 246 to generate an image of the target 238 based upon the optical radiation received by the receiving electronics. In various embodiments, the beam diameter is between 20 and 40 microns; lens 240 is a graded index lens; the interface medium 236 provides a reference reflection of between −28 and −42 dB the interface medium 236 is an adhesive; the system 232 is configured such that the receiving electronics operating in a total noise range that is within 5 dB of a shot noise limit; an image of the target 238 has a resolution of 6-15 microns; a display is provided to display the images generated by the processor 246; the distal end of the optical fiber 234 is embedded in the interface medium; an index of refraction of the optical fiber 234 is different than an index of refraction of the interface medium 236; and the interface medium 236 has an outer surface along the side-opening window that is concave.

As illustrated in FIGS. 24-28 semiconductor optical amplifier 200 can use artificial intelligence (AI) for SOA 200 current operation, future operations, changes in operations, and the like, as set forth in the parameters above. Examples of AI used include but are not limited to: including linear regression, logistic regression, decision tree, SVM algorithm, Naive Bayes algorithm, KNN algorithm, K-means, random forest algorithm, dimensionality reduction, and the like.

As a non-limiting example, a k-means algorithm is used. In various embodiments, semiconductor optical amplifier 200 can use artificial intelligence (AI), for semiconductor optical amplifier 200 operations, future operations, changes in operations, as set forth in the parameters above. Examples of AI used include but are not limited to including linear regression, logistic regression, decision tree, SVM algorithm, Naive Bayes algorithm, KNN algorithm, K-means, random forest algorithm, dimensionality reduction, and the like. As a non-limiting example, a k-means algorithm is used.

Referring to FIGS. 24-28, in one embodiment, a user can seek from system a recommendation from the server and/or a recommendation engine 300. In one embodiment, the recommendation engine 300 make one or more recommendations that can be can be displayed at a display 302.

The recommendation engine 300 contains identifications and profiles of users who have posted recommendations/ratings, as well as profiles for users and usage feedback for videos and streamed media. A user seeking to use the recommendation engine 300 is presented (at some time) with a set of questions or the system otherwise obtains data inputs defining the characteristics of the user. In this case, the user characteristics generally define the context which is used to interpret or modify the basic goal of the user, and therefore the reference-user(s) for the user, though the user may also define or modify the context at the time of use. Various considerations are used in a cluster analysis, in which recommendations relevant to the contexts may be presented, with a ranking according to the distance function from the "cluster definition." As discussed above, once the clustering is determined, advertisements may be selected as appropriate for the cluster, to provide a subsidy for operation of the system, and also to provide relevant information for the user about available products.

Clustering algorithms partition data into a certain number of clusters (groups, subsets, or categories). Important considerations include feature selection or extraction (choosing distinguishing or important features, and only such features); Clustering algorithm design or selection (accuracy and precision with respect to the intended use of the classification result; feasibility and computational cost; etc.); and to the extent different from the clustering criterion, optimization algorithm design or selection.

Finding nearest neighbors can require computing the pairwise distance between all points. However, clusters and their cluster prototypes might be found more efficiently. Assuming that the clustering distance metric reasonably includes close points, and excludes far points, then the neighbor analysis may be limited to members of nearby clusters, thus reducing the complexity of the computation.

There are generally three types of clustering structures, known as partitional clustering, hierarchical clustering, and individual clusters. The most commonly discussed distinction among different types of clustering's is whether the set of clusters is nested or unnested, or in more traditional terminology, hierarchical or partitional. A partitional clustering is simply a division of the set of data objects into non-overlapping subsets (clusters) such that each data object is in exactly one subset. If the clusters have sub-clusters, then we obtain a hierarchical clustering, which is a set of nested clusters that are organized as a tree. Each node (cluster) in the tree (except for the leaf nodes) is the union of its children (sub-clusters), and the root of the tree is the cluster containing all the objects. Often, but not always, the leaves of the tree are singleton clusters of individual data objects. A hierarchical clustering can be viewed as a sequence of partitional clustering's and a partitional clustering can be obtained by taking any member of that sequence; i.e., by cutting the hierarchical tree at a particular level.

There are many situations in which a point could reasonably be placed in more than one cluster, and these situations are better addressed by non-exclusive clustering. In the most general sense, an overlapping or non-exclusive clustering is used to reflect the fact that an object can simultaneously belong to more than one group (class). A non-exclusive clustering is also often used when, for example, an object is "between" two or more clusters and could reasonably be assigned to any of these clusters. In a fuzzy clustering, every object belongs to every cluster with a membership weight. In other words, clusters are treated as fuzzy sets. Similarly, probabilistic clustering techniques compute the probability with which each point belongs to each cluster.

In many cases, a fuzzy or probabilistic clustering is converted to an exclusive clustering by assigning each object to the cluster in which its membership weight or probability is highest. Thus, the inter-cluster and intra-cluster distance function is symmetric. However, it is also possible to apply a different function to uniquely assign objects to a particular cluster.

A well-separated cluster is a set of objects in which each object is closer (or more similar) to every other object in the cluster than to any object not in the cluster. Sometimes a threshold is used to specify that all the objects in a cluster must be sufficiently close (or similar) to one another. The distance between any two points in different groups is larger than the distance between any two points within a group. Well-separated clusters do not need to be spherical, but can have any shape.

If the data is represented as a graph, where the nodes are objects and the links represent connections among objects, then a cluster can be defined as a connected component; i.e., a group of objects that are significantly connected to one another, but that have less connected to objects outside the group. This implies that each object in a contiguity-based cluster is closer to some other object in the cluster than to any point in a different cluster.

A density-based cluster is a dense region of objects that is surrounded by a region of low density. A density-based definition of a cluster is often employed when the clusters are irregular or intertwined, and when noise and outliers are present. DBSCAN is a density-based clustering algorithm that produces a partitional clustering, in which the number of clusters is automatically determined by the algorithm. Points in low-density regions are classified as noise and omitted; thus, DBSCAN does not produce a complete clustering.

A prototype-based cluster is a set of objects in which each object is closer (more similar) to the prototype that defines the cluster than to the prototype of any other cluster. For data with continuous attributes, the prototype of a cluster is often a centroid, i.e., the average (mean) of all the points in the cluster. When a centroid is not meaningful, such as when the data has categorical attributes, the prototype is often a medoid, i.e., the most representative point of a cluster. For many types of data, the prototype can be regarded as the most central point. These clusters tend to be globular. K-means is a prototype-based, partitional clustering technique that attempts to find a user-specified number of clusters (K), which are represented by their centroids. Prototype-based clustering techniques create a one-level partitioning of the data objects. There are a number of such techniques, but two of the most prominent are K-means and K-medoid. K-means defines a prototype in terms of a centroid, which is usually the mean of a group of points, and is typically applied to objects in a continuous n-dimensional space. K-medoid defines a prototype in terms of a medoid, which is the most representative point for a group of points, and can be applied to a wide range of data since it requires only a proximity measure for a pair of objects. While a centroid almost never corresponds to an actual data point, a medoid, by its definition, must be an actual data point.

In the k-means clustering technique K initial centroids are selected, the number of clusters desired. Each point in the data set is then assigned to the closest centroid, and each collection of points assigned to a centroid is a cluster. The centroid of each cluster is then updated based on the points assigned to the cluster. We iteratively assign points and update until convergence (no point changes clusters), or equivalently, until the centroids remain the same. For some combinations of proximity functions and types of centroids, K-means always converges to a solution; i.e., K-means reaches a state in which no points are shifting from one cluster to another, and hence, the centroids do not change. Because convergence tends to b asymptotic, the end condition may be set as a maximum change between iterations. Because of the possibility that the optimization results in a local minimum instead of a global minimum, errors may be maintained unless and until corrected. Therefore, a human assignment or reassignment of data points into classes, either as a constraint on the optimization, or as an initial condition, is possible.

To assign a point to the closest centroid, a proximity measure is required. Euclidean (L2) distance is often used for data points in Euclidean space, while cosine similarity may be more appropriate for documents. However, there may be several types of proximity measures that are appropriate for a given type of data. For example, Manhattan (L1) distance can be used for Euclidean data, while the Jaccard measure is often employed for documents. Usually, the similarity measures used for K-means are relatively simple since the algorithm repeatedly calculates the similarity of each point to each centroid, and thus complex distance functions incur computational complexity. The clustering may be computed as a statistical function, e.g., mean square error of the distance of each data point according to the distance function from the centroid. Note that the K-means may only find a local minimum, since the algorithm does not test each point for each possible centroid, and the starting presumptions may influence the outcome. The typical distance functions for documents include the Manhattan (L1) distance, Bregman divergence, Mahalanobis distance, squared Euclidean distance and cosine similarity.

An optimal clustering will be obtained as long as two initial centroids fall anywhere in a pair of clusters, since the centroids will redistribute themselves, one to each cluster. As the number of clusters increases, it is increasingly likely that at least one pair of clusters will have only one initial centroid, and because the pairs of clusters are further apart than clusters within a pair, the K-means algorithm will not redistribute the centroids between pairs of clusters, leading to a suboptimal local minimum. One effective approach is to take a sample of points and cluster them using a hierarchical clustering technique. K clusters are extracted from the hierarchical clustering, and the centroids of those clusters are used as the initial centroids. This approach often works well, but is practical only if the sample is relatively small, e.g., a few hundred to a few thousand (hierarchical clustering is expensive), and K is relatively small compared to the sample size. Other selection schemes are also available.

The space requirements for K-means are modest because only the data points and centroids are stored. Specifically, the storage required is $O((m+K) n)$, where m is the number of points and n is the number of attributes. The time requirements for K-means are also modest-basically linear in the number of data points. In particular, the time required is $O(I \times K \times m \times n)$, where I is the number of iterations required for convergence. As mentioned, I is often small and can usually be safely bounded, as most changes typically occur in the first few iterations. Therefore, K-means is linear in m, the number of points, and is efficient as well as simple provided that K, the number of clusters, is significantly less than m.

Outliers can unduly influence the clusters, especially when a squared error criterion is used. However, in some clustering applications, the outliers should not be eliminated or discounted, as their appropriate inclusion may lead to important insights. In some cases, such as financial analysis, apparent outliers, e.g., unusually profitable investments, can be the most interesting points.

Hierarchical clustering techniques are a second important category of clustering methods. There are two basic approaches for generating a hierarchical clustering: Agglomerative and divisive. Agglomerative clustering merges close clusters in an initially high dimensionality space, while divisive splits large clusters. Agglomerative clustering relies upon a cluster distance, as opposed to an object distance. For example, the distance between centroids or medoids of the clusters, the closest points in two clusters, the further points in two clusters, or some average distance metric. Ward's method measures the proximity between two clusters in terms of the increase in the sum of the squares of the errors that results from merging the two clusters.

Agglomerative Hierarchical Clustering refers to clustering techniques that produce a hierarchical clustering by starting with each point as a singleton cluster and then repeatedly merging the two closest clusters until a single, all-encompassing cluster remains. Agglomerative hierarchical clustering cannot be viewed as globally optimizing an objective function. Instead, agglomerative hierarchical clustering techniques use various criteria to decide locally, at each step, which clusters should be merged (or split for divisive approaches). This approach yields clustering algorithms that avoid the difficulty of attempting to solve a hard combinatorial optimization problem. Furthermore, such approaches do not have problems with local minima or difficulties in choosing initial points. Of course, the time complexity of $O(m2 \log m)$ and the space complexity of $O(m2)$ are prohibitive in many cases. Agglomerative hierarchical clustering algorithms tend to make good local decisions about combining two clusters since they can use information about the pair-wise similarity of all points. However, once a decision is made to merge two clusters, it cannot be undone at a later time. This approach prevents a local optimization criterion from becoming a global optimization criterion.

In supervised classification, the evaluation of the resulting classification model is an integral part of the process of developing a classification model. Being able to distinguish whether there is non-random structure in the data is an important aspect of cluster validation.

In one embodiment, a k-means algorithm is used as follows:

The K Means Clustering algorithm finds observations in a dataset that are like each other and places them in a set. The process starts by randomly assigning each data point to an initial group and calculating the centroid for each one. A centroid is the center of the group. Note that some forms of the procedure allow you to specify the initial sets.

Then the algorithm continues as follows: it evaluates each observation, assigning it to the closest cluster. The definition of "closest" is that the Euclidean distance between a data point and a group's centroid is shorter than the distances to the other centroids.

When a cluster gains or loses a data point, the K means clustering algorithm recalculates its centroid.

The algorithm repeats until it can no longer assign data points to a closer set.

When the K means clustering algorithm finishes, all groups have the minimum within-cluster variance, which keeps them as small as possible. Sets with minimum variance and size have data points that are as similar as possible. There is variability amongst the characteristics in each cluster, but the algorithm minimizes it.

In short, the observations within a set should share characteristics. In some cases, the analysts might need to specify different numbers of groups to determine which value of K produces the most useful results.

In one embodiment, recommendation engine 300 is used to predict what will happen; or prescriptive, relative to semiconductor optical amplifier 200 data uses the data to make suggestions about what action to take, As a nonlimiting example, artificial intelligence provides predictive information about SOA 200, including but not limited to temperature, modification of temperature, wavelength sweeping, wavelength, isolation, feedback, and the like.

As a non-limiting example, the artificial intelligence engine 300 is used for systems with a deep learning networks with many layers. The layered network can process extensive amounts of data and determine the "weight" of each link in the network—for example, in an image recognition system, some layers of the neural network might detect individual features of a face, like eyes, nose, or mouth, while another layer would be able to tell whether those features appear in a way that indicates a face.

As will be appreciated by those skilled in the art, there are many different artificial intelligence engines 300 that can be trained to generate suitable output values for a range of input values; the neuro-fuzzy logic engine 300 is merely one embodiment.

The measurement data, the information feeds, and the output parameters may be used to train an artificial intelligence engine 300 to control the one or more devices in response to the measurement data and information feeds In one embodiment, artificial intelligence engines 1000 can be trained to recognize temporal patterns.

In one embodiment, the measurement data, the information feeds, and the output parameters may be used to train an artificial intelligence engine 1000 to control the one or more devices in response to the measurement data and information feeds.

In one embodiment, a computing system 310 is used and includes a logic subsystem 311 and a storage subsystem 312. Computing system 310 may further include an input subsystem 314, an output subsystem 316, a communication subsystem 318, and/or other components.

Logic subsystem 311 may include one or more physical logic devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem 311 may include one or more processors (as an example of physical logic devices) configured to execute software instructions. Additionally, or alternatively, the logic subsystem may include one or more hardware and/or firmware logic machines (as an example of physical logic devices) configured to execute hardware or firmware instructions. Processors of the logic subsystem may be single-core or multi-core, and the instructions executed thereon may be configured for sequential, parallel, and/or distributed processing. Individual components of the logic subsystem may be distributed among two or more separate devices, which may be remotely located and/or configured for coordinated processing. Aspects of the logic subsystem may be virtualized and executed by remotely accessible, networked computing devices configured in a cloud-computing configuration.

Storage subsystem 312 includes one or more physical, non-transitory memory devices configured to hold instructions executable by the logic subsystem in non-transitory form, to implement the methods and processes described herein. When such methods and processes are implemented, the state of storage subsystem 12 may be transformed. e.g., to hold different data. Storage subsystem 312 may include removable and/or built-in devices. Storage subsystem 312 may include optical memory devices, semiconductor memory devices, and/or magnetic memory devices, among other suitable forms. Storage subsystem 312 may include volatile, nonvolatile, dynamic, static, read/write, read-only, random-access, sequential-access, location-addressable, file-addressable, and/or content-addressable devices. Aspects of logic subsystem 310 and storage subsystem 312 may be integrated together into one or more hardware-logic components. While storage subsystem 312 includes one or more physical devices, aspects of the instructions described herein alternatively may be propagated by a communication medium (e.g., an electromagnetic signal, an optical signal, etc.) that is not necessarily held by a physical device for a finite duration.

The terms "module," "program," and "engine" may be used to describe an aspect of computing system 310 implemented to perform a particular function. In some cases, a module, program, or engine may be instantiated via logic subsystem 110 executing instructions held by storage subsystem 312. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc. A "service," as used herein, may refer to an application program executable across multiple user sessions. A service may be available to one or more system components, programs, and/or other services. In some implementations, a service may run on one or more server-computing devices.

In one embodiment, system 310 can be coupled to a memory 410, output device 412, a database 414, computing system 411, an input 416 and processor 41. System 310 can receive input from the one or more sensors.

As a non-limiting example, data, input from the one or more sensors, is received in a first format 416, translated into tokens 418, tokens are stored in an array 420, a determination is made whether the array contains composite concepts 422, if yes, the tokens are replaced in an array which include a composite with composite tokens 424, if not a determination is made whether token in the array are derived from root tokens 426, if yes then root tokens are added to the array 428, all token are added to the array is that are derived from array root tokens 430, is not, then a determination is made if tokens in the array have a relationship with and other tokens 432, if so the relationships are added to the array 434, if not an input array is constructed 436.

In one embodiment, the input array 420 is compared to the stored conceptual token array 438 and a dynamic constructed output is created using a selected output pattern as a starting point 440.

In one embodiment, an incomplete output pattern 442 is used to transmit an output array 444.

As a non-limiting example, the input can be translated into a second format such as an integer format. The input may be broken into tokens which are each assigned a corresponding integer. The input is stored in an input array, which is a one-dimensional linear array that contains one token for each integer or item of input. In one embodiment, each token is assigned an integer value, so the token "cookie" may be assigned a value of "0056."

System 310 can use training and a machine learning program that includes features, message words, message concepts, communication history, past behaviors, one or more subjects, message attributes, one or more senders, user data, training data, machine-learning program training, one or more trained ML programs, new data and one or more assessments.

The tokens are assigned predetermined integer values based on a database available to the system that stores integer values for all words. Various different tokens that have the same meaning, such as "cookie" and "cookies" may be assigned the same integer value.

Once the one-dimensional linear array is constructed, the system may then determine whether one or more tokens in the input array correlate to one or more predetermined criteria, such as for example, whether any one or more tokens in the array comprise a term of art or if two or more tokens in the array comprise a composite concept. This occurs when a string of words is meant to express a single idea. In one embodiment, if any one or more tokens are found to comprise a term of art or if one or more tokens are found to comprise a composite concept, they are replaced in the input array by a token representing the corresponding term of art or composite concept. In another embodiment, one or more tokens representing the term of art or composite concept may be added to the input array.

Common phrases may also be converted from a plurality of integers into a single integer. For example, the words "May I please have" may be represented by the integer values 001, 002, 003, and 004. The words, "Can you get me" may be represented by the integer 005, 006, 007, and 008. However, because these two strings mean the same thing, they may both be stored in the string database under the variable 056. The system will then convert these strings into the variable 056, which reduces the number of variables the system must work with and thus reduces processing time for analyzing the input and formulating a response.

The formula for calculating the number of linear arrays can be: $(X1+1)(X2+1)(X3+1) \ldots (Xn+1)$ where n is the number of tokens in the array and X is the number of tokens corresponding to each root token. When applied to the example shown in FIG. 5, the input array is expanded into 192 separate linear arrays. There are 5 tokens in the array, so the formula would look as follows: $(X1+1)(X2+1)(X3+1)(X4+1)(X5+1)$. The "X" for each token is replaced by the number of tokens corresponding to each token, so the formula would look as follows once the input array was expanded.

The various processes and elements, such as concepts, output patterns, and other databases utilized by the system can be stored in memory 410 such as, for example, a random access memory in order to speed processing of system. In other embodiments, these processes and elements may be stored on a hard disk drive, flash memory drive, read-only memory, or any other type of memory device depending on the needs of the user.

In one embodiment, the algorithms used can be encrypted with methods known in the art before being stored in memory 410 in order to prevent copying or reverse engineering. In one embodiment, the algorithms are compressed and encrypted for further protection. A number of methods of digital rights management as known in the art may also be used to prevent copying of the algorithms used to implement the present invention.

Each of the following references is expressly incorporated herein by reference in its entirety:

Abraham, Ittai, et al. "Low-distortion inference of latent similarities from a multiplex social network." SIAM Journal on Computing 44.3 (2015): 617-668.
Aldenderfer, M. S., and R. K. Blashfield. Cluster Analysis. Sage Publications, Los Angeles, 1985.
Anderberg, M. R. (1973). Cluster Analysis for Applications. Academic Press, New York.
Anderson, E. (1957). A semi-graphical method for the analysis of complex problems. Proc. Nat. Acad. Sci. USA 43923-927.
Anderson, T. W. (1958). An Introduction to Multivariate Statistical Analysis. Wiley, New York.
Anderson, T. W., and Bahadur, R. R. (1962). classification into two multivariate normal distributions with different covariance matrices. Ann. Math. Statist. 33420-431.
Andrews, D. F. (1972). Plots of high-dimensional data. Biometrics 28 125-136.
Ankerst, M., M. M. Breunig, H.-P. Kriegel, and J. Sander. OPTICS: Ordering Points To Identify the Clustering Structure. In Proc. of 1999 ACM-SIGMOD Intl. Conf. on Management of Data, pages 49-60, Philadelphia, Pa., June 1999. ACM Press.
Arabie, P. (1977). clustering representations of group overlap. J. Math. Soc. 5 112-128.
Arabie, P. and Carroll, J. D. (1980). MAPCLUS: A mathematical programming approach to fitting to ADCLUS model. Psychometrika 45211-235.
Arabie, P., L. Hubert, and G. D. Soete. An overview of combinatorial data analysis. In P. Arabie, L. Hubert, and G. D. Soete, editors, Clustering and Classification, pages 188-217. World Scientific, Singapore, January 1996.
Art, D., Gnanadesikan, R., and Kettenring, J. R. (1982). Data-based metrics for cluster analysis. Utilitas Mathematica 31A 75-99.
Asimov, D. (1985). The grand tour. SLAM J. Sci. Statist. Corn-put. 6 128-143.
Auffarth, Benjamin, Yasumasa Muto, and Yasuharu Kunii. "An artificial system for visual perception in autonomous Robots." Proceedings of the IEEE International Conference on Intelligent Engineering Systems. 2005.
Babu, B. Hari, N. Subash Chandra, and T. Venu Gopal. "Clustering Algorithms For High Dimensional Data—A Survey Of Issues And Existing Approaches."
Baker, F. B. (1974). Stability of two hierarchical grouping techniques, Case I: Sensitivity to data errors. J. Amer. Statist. Assoc. 69440-445.
Ball, G., and D. Hall. A Clustering Technique for Summarizing Multivariate Data. Behavior Science, 12:153-155, March 1967.
Banerjee, A., S. Merugu, I. S. Dhillon, and J. Ghosh. Clustering with Bregman Divergences. In Proc. of the 2004 SIAM Intl. Conf. on Data Mining, pages 234-245, Lake Buena Vista, Fla., April 2004.
Baraglia, R., Dazzi, P., Mordacchini, M., & Ricci, L. (2013). A peer-to-peer recommender system for self-emerging user communities based on gossip overlays. Journal of Computer and System Sciences, 79(2), 291-308.
Baragliaa, R., Dazzia, P., Mordacchinib, M., & Riccic, L. A Peer-to-Peer Recommender System for self-emerging user communities based on Gossip Overlays. (2012)
Beck, Carolyn, et al. "Dynamic Coverage and Clustering: A Maximum Entropy Approach." Distributed Decision Making and Control. Springer London, 2012. 215-243.
Becker, P. (1968). Recognitions of Patterns. Polyteknisk, Copenhagen.
Bell, P. A. and Korey, J. L. (1975). QUICLSTR: A FORTRAN program for hierarchical cluster analysis with a large number of subjects. Behavioral Research Methods and Instrumentation 7575.
Berg, Mikko. "Human abilities to perceive, understand, and manage multi-dimensional information with visualizations." (2012).
Birkin, P. Survey Of Clustering Data Mining Techniques. Technical report, Accrue Software, San Jose, Calif., 2002.
Bhat, Sajid Yousuf, and Muhammad Abolish. "A density-based approach for mining overlapping communities from social network interactions." Proceedings of the 2nd International Conference on Web Intelligence, Mining and Semantics. ACM, 2012.
Binder, D. A. (1978). Comment on 'Estimating mixtures of normal distributions and switching regressions.' j Amer. Statist. Assoc. 73746-747.
Blashfield, R. K., Aldenderfer, M. S. and Morey, L. C. (1982). cluster analysis literature on validation. In Classifying Social Data. (H. Hudson, ed.) 167-176. Jossey-Bass, San Francisco.

Bock, H. H. (1985). On significance tests in cluster analysis. J. Classification 277-108.

Boley, D. Principal Direction Divisive Partitioning. Data Mining and Knowledge Discovery, 2(4): 325-344, 1998.

Bosley, Daniel, and Vivian Borst. "A General Unsupervised Clustering Tool for Unstructured Data." matrix 100:2.

Boratto, Ludovico. "Group recommendation with automatic detection and classification of groups." (2012).

Bradley, P. S. and U. M. Fayyad. Refining Initial Points for K-Means Clustering. In Proc. of the 15th Intl. Conf. on Machine Learning, pages 91-99, Madison, Wis., July 1998. Morgan Kaufmann Publishers Inc.

Breiman, L. Meisel, W. S., and Purcell, E. (1977). Variable kernel estimates of multivariate densities and their calibration. Technometrics 19 135-144.

Brineman, L., Friedman, J. H., Olshen, R. A., and Stone, C. J. (1984). Classification and Regression Trees. Wadsworth, Belmont, Calif.

Broadbent, S. R. and Hammersley, J. M. (1957). Percolation Processes, I: Crystals and Mazes. Proc. Cambridge Philos. Soc. 53629-641.

Bu, Yingyi, et al. "The HaLoop approach to large-scale iterative data analysis." The VLDB Journal—The International Journal on Very Large Data Bases 21.2 (2012): 169-190.

Buja, A., Hurify, C. and Mcdonald, J. A. (1986). A data viewer for multivariate data. Computer Science and Statistics: Proceedings of the 18th Symposium on the Interface 171-174.

Cacoullos, T. (1966). Estimation of a multivariate density. Ann. Math. Statist. 18 179-189.

Cal, Rui, et al. "Scalable music recommendation by search." Proceedings of the 15th international conference on Multimedia. ACM, 2007.

Carrizosa, Emilio, and Dolores Romero Morales. "Supervised classification and mathematical optimization." Computers & Operations Research 40.1 (2013): 150-165.

Chang, Chin-Chun, and Hsin-Yi Chen. "Semi-supervised clustering with discriminative random fields." Pattern Recognition 45.12 (2012): 4402-4413.

Chen, H., Gnanadesikan, R., and Kettenring, J. R. (1974). Statistical methods for grouping corporations. Sankhya B 36 1-28.

Chen, Yen Hung. "The k Partition-Distance Problem." Journal of Computational Biology 19.4 (2012): 404-417.

Cheng, Hong, et al. "Clustering large attributed information networks: an efficient incremental computing approach." Data Mining and Knowledge Discovery 25.3 (2012): 450-477.

Chernoff, H. (1972). The selection of effective attributes for deciding between hypotheses using linear discriminant functions. In Frontiers of Pattern Recognition. (S. Watanabe, ed.) 55-60. Academic Press, New York.

Chernoff, H. (1973a). Some measures for discriminating between normal multivariate distributions with unequal covariance matrices. In Multivariate Analysis Ill. (P. R. Krishnaiah, ed.) 337-344. Academic Press, New York.

Chernoff, H. (1973b). The use of faces to represent points in k-dimensional space graphically. J Amer. Statist. Assoc. 68 361-368.

Cherubini, Umberto, and Agnese Sironi. Bond Trading, Market Anomalies and Neural Networks: An Application with Kohonen Nets. No. _012. Society for Computational Economics.

Christou, Ioannis T., George Gekas, and Anna Kyrikou. "A classifier ensemble approach to the TV-viewer profile adaptation problem." International Journal of Machine Learning and Cybernetics 3.4 (2012): 313-326.

Clunies-Ross, C. W. and Riffenburgh, R. H. (1960). Geometry and linear discrimination. Biometrika 47185-189.

Cormack, R. M. (1971). A review of classification (with discussion). J Roy. Statist. Soc. A 134321-367.

Cover, T. M. (1968). Estimation by the nearest neighbor rule. IEEE Transactions Information Theory IT-14 50-55.

Cover, T. M. and Hart, P. E. (1967). Nearest neighbor pattern classification. IEEE Transactions, Information Theory IT-13 21-27.

Dallal, G. E. (1975) A user's guide to J. A. Hartigan's clustering algorithms. (unpublished manuscript) Yale University.

Day, N. E. (1969). Estimating the components of a mixture of normal distributions. Biometrika 56463-474.

Day, N. E., and Kerridge, D. F., (1967). A general maximum likelihood discriminant. Biometrics 23313-323. 94 de Master, Trabajo Fin. "Novelty and Diversity Enhancement and Evaluation in Recommender Systems." (2012).

Defays, D. (1977). An efficient algorithm for a complete link method. Computer Journal 20364-366.

Derrac, Joaquín, Isaac Triguero, Salvador García, and Francisco Herrera. "Integrating instance selection, instance weighting, and feature weighting for nearest neighbor classifiers by coevolutionary algorithms."

It is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

The invention claimed is:

1. A semiconductor optical amplifier system (SOA) system, comprising:
   a VCSEL including:
   a first mirror;
   one or more active regions with a first active region adjacent to the first mirror, each of an active region including quantum wells and barriers, each of an active region surrounded by one or more p-n junctions, the one or more active regions including a selected shape structure each with a tunnel junction (TJ);
   one or more apertures provided with the selected shape structure;
   one or more buried tunnel junctions (BTJ), additional TJ's, planar structures and/or additional BTJ's are created during a regrowth process that is independent of a first growth process of the first mirror, the active region and the one or more TJs;
   one or more electrical confinement apertures defined by the one or more BTJ's, additional TJ's, planar structures and/or additional BTJ;
   a vertical resonator cavity disposed over the electrical confinement aperture;
   a high contrast grating (HCG) operating as a second mirror positioned over the vertical resonator cavity, the HCG configured to reflect a first portion of light back into the vertical resonator cavity, and a second portion of the light as an output beam from the VCSEL, the HCG structure being layered on the selected shape structure;
wherein a shape of the output beam of the tunable VCSEL laser is determined by a geometric shape of the one or more BTJ apertures, apertures for additional TJ's, planar structures and/or additional BTJ's, with a transmission function of the HCG and is designed according to the desired optical transmission function of the application; and
at least one of an ASIC and driver controller coupled to the VCSEL laser, the ASIC monitoring an output of a light pulse over wavelength.

2. The (SOA) system of claim 1, wherein the ASIC shapes a drive pulse to create a linear wavelength output.

3. The (SOA) system of claim 1, further comprising:
an optical isolator positioned at an exterior of the VCSEL.

4. The (SOA) system of claim 1, further comprising:
an optical isolator positioned at an exterior of the VCSEL at a front of the tunable VCSEL laser.

5. The (SOA) system of claim 1, further comprising:
a polarization maintaining optical fiber coupled to the amplifier.

6. The (SOA) system of claim 1, further comprising:
a fiber coupled to the amplifier, the fiber coupling diodes at 1310 nm, and 1550 to the fiber and the amplifier.

7. The (SOA) system of claim 1, further comprising:
a thermistor with the TEC for temperature control loop.

8. The (SOA) system of claim 1, further comprising:
a photo detector at an output of the VCSEL and a detector at an output of an optical amplifier configured to monitor optical power.

9. The (SOA) system of claim 8, wherein the photo detector at the output of the tunable VCSEL laser and the photo detector at the output of the amplifier are configured to flatten a power curve of the optical amplifier.

10. The (SOA) system of claim 1, further comprising:
at least one of: a wavelength locker coupled to the optical amplifier; and a wavelength calibration spike filter, configured to provide wavelength control and an exact wavelength reference.

11. The (SOA) system of claim 10, wherein the at least one of:
a wavelength locker coupled to the optical amplifier; and a wavelength calibration spike filter, are integrated as an optical photonic integrated circuit (PIC) to assist in miniaturization.

12. The (SOA) system of claim 1, further comprising:
a photo diode monitor coupled to the tunable VCSEL laser, the photo diode monitoring including the photo diode, K-clock, and a wavelength locker.

13. An optical coherence tomography (OCT) system, comprising:
a tunable VCSEL system, comprising:
a tunable VCSEL including:
a first mirror;
one or more active regions with a first active region adjacent to the first mirror, each of an active region including quantum wells and barriers, each of an active region surrounded by one or more p-n junctions, the one or more active regions including a selected shape structure each with a tunnel junction (TJ);
one or more apertures provided with the selected shape structure;
one or more buried tunnel junctions (BTJ), additional TJ's, planar structures and/or additional BTJ's are created during a regrowth process that is independent of a first growth process of the first mirror, the active region and the one or more TJs;
one or more electrical confinement apertures defined by the one or more BTJ's, additional TJ's, planar structures and/or additional BTJ;
a vertical resonator cavity disposed over the electrical confinement aperture;
a high contrast grating (HCG) operating as a second mirror positioned over the vertical resonator cavity, the HCG configured to reflect a first portion of light back into the vertical resonator cavity, and a second portion of the light as an output beam from the VCSEL, the HCG structure being layered on the selected shape structure;
wherein a shape of the output beam of the tunable VCSEL laser is determined by a geometric shape of the one or more BTJ apertures, apertures for additional TJ's, planar structures and/or additional BTJ's, with a transmission function of the HCG and is designed according to the desired optical transmission function of the application; and
an interface medium at a distal end of an optical fiber;
a lens in optical contact with the interface medium, the lens configured to focus optical radiation through the side-opening window to a focal point in the target,
wherein a beam diameter at the focal point is between 10 and 60 microns;
receiving electronics configured to receive the optical radiation reflected from the interface medium and the target; and
a processor to generate an image of the target based upon the optical radiation received by the receiving electronics.

14. The (OCT) of claim 13, wherein the lens is a graded index lens.

15. The (OCT) system of claim 13, wherein the interface medium provides a reference reflection of between −28 and −42 db.

16. The (OCT) system of claim 13 wherein the interface medium is an adhesive.

17. The (OCT) system of claim 13, wherein the system is configured such that the receiving electronics operate in a total noise range that is within 5 dB of the shot noise limit.

18. The (OCT) system of claim 13, wherein the image has a resolution of 6-15 microns.

19. The (OCT) system of claim 13, further comprising a display configured to display the images generated by the processor.

20. The (OCT) system of claim 13, wherein the distal end of the optical fiber is embedded in the interface medium.

* * * * *